(12) United States Patent
Pop

(10) Patent No.: US 10,755,549 B2
(45) Date of Patent: Aug. 25, 2020

(54) HIGH VOLTAGE SAFETY SYSTEM AND METHOD FOR ELECTRICAL CABINETRY

(71) Applicant: Florin Pop, Morton Grove, IL (US)

(72) Inventor: Florin Pop, Morton Grove, IL (US)

(*) Notice: Subject to any disclaimer, the term of this patent is extended or adjusted under 35 U.S.C. 154(b) by 0 days.

(21) Appl. No.: 16/255,675

(22) Filed: Jan. 23, 2019

(65) Prior Publication Data
US 2019/0228635 A1    Jul. 25, 2019

Related U.S. Application Data

(60) Provisional application No. 62/621,932, filed on Jan. 25, 2018.

(51) Int. Cl.
| | |
|---|---|
| G08B 21/00 | (2006.01) |
| G08B 21/18 | (2006.01) |
| G01R 15/18 | (2006.01) |
| G01R 15/20 | (2006.01) |
| G08B 7/06 | (2006.01) |
| G01R 19/00 | (2006.01) |
| H05B 45/00 | (2020.01) |
| H05B 47/105 | (2020.01) |
| H05B 47/185 | (2020.01) |
| H02B 7/00 | (2006.01) |

(52) U.S. Cl.
CPC ............. *G08B 21/18* (2013.01); *G01R 15/18* (2013.01); *G01R 15/202* (2013.01); *G01R 19/0092* (2013.01); *G08B 7/06* (2013.01); *H05B 45/00* (2020.01); *H05B 47/105* (2020.01); *H05B 47/185* (2020.01); *H02B 7/00* (2013.01)

(58) Field of Classification Search
None
See application file for complete search history.

(56) References Cited

U.S. PATENT DOCUMENTS

| 8,212,405 B2 * | 7/2012 | Pifer ........................ H02J 9/06 |
| | | 307/70 |
| 2012/0194344 A1 * | 8/2012 | McNamara ............. H02J 13/00 |
| | | 340/584 |

(Continued)

OTHER PUBLICATIONS

"LM3406 1.5-A, Constant Current, Buck Regulator for Driving High Power LEDs," Texas Instruments, 1-38 (2008).

*Primary Examiner* — Adolf Dsouza
(74) *Attorney, Agent, or Firm* — HoustonHogle LLP

(57) ABSTRACT

A safety system for high-voltage electrical cabinetry provides active visual and/or audible warnings during maintenance. Load monitors evaluate electrical loads of dedicated power circuits used by an existing automatic lighting system. Light and sound indicators present status information (e.g. indicating maintenance status or normal operating status) to persons in signaling areas based on whether the evaluated electrical loads indicate that at least one lamp is turned on. A common power supply can be used to power the lighting circuit and the indicators. Bridge modules can also be used to monitor the electrical load for different group lighting circuits and report discrete group status information to a programmable logic controller while also sharing the group status information with the other bridge modules. In this case, the indicators present combined status information, for example, indicating a maintenance status if any lamps from any group is turned on.

44 Claims, 14 Drawing Sheets

(56) References Cited

U.S. PATENT DOCUMENTS

| | | | |
|---|---|---|---|
| 2015/0035432 A1* | 2/2015 | Kendall | F25D 27/005 315/76 |
| 2019/0172189 A1 | 6/2019 | Pop | |

* cited by examiner

HIGH VOLTAGE SAFETY SYSTEM AND METHOD FOR ELECTRICAL CABINETRY

RELATED APPLICATIONS

This application claims the benefit under 35 USC 119(e) of U.S. Provisional Application No. 62/621,932, filed on Jan. 25, 2018, which is incorporated herein by reference in its entirety.

BACKGROUND OF THE INVENTION

High-voltage electrical switchgear is used to control, protect, and isolate electrical equipment providing power to premises such as office buildings, hospitals, warehouses, data centers, factories, retail establishments, shopping malls, schools, multi-unit dwellings, government buildings, and embassies, to name a few examples. Typically, in an enclosed building, the high-voltage switchgear is contained in one or more cabinets located in a secure electrical room. Depending on the voltage levels involved, the switchgear may be located in an electrical substation or in an outdoor staging area. The high-voltage switchgear includes programmable logic controllers (PLC) configured to control one or more cabinets, and each cabinet may include high-voltage, high-current power conducting elements such as circuit breakers, fuses, switches, lightning arrestors, and other components used to energize and de-energize the switchgear to allow work to be performed and clear faults downstream.

Switchgear can be dangerous, and accidents can, and do occur. This is especially true, for example, when the high-voltage equipment is re-energized. During re-energization of the equipment, if an abnormal condition develops, which may be caused by poor design, a stray object or tool being dropped inside the cabinet, by faulty wiring, or by a ground-fault, a large electrical arc or an explosion may be produced. Such an electrical arc can be lethal many feet away, and depending on the power levels involved, could be potentially lethal to anyone within the entire electrical room. A large electrical arc may be produced even at lower voltages, such as 480 volts.

As a result, safety procedures are used to protect technicians performing maintenance work as well as other individuals who might be in the proximity of the maintenance work and thus at risk of harm. These safety procedures are often specified by safety organizations such as Underwriters Laboratories (UL) and in some cases required by local regulations and/or electrical codes. In many places, only certain qualified technicians (e.g. trained and certified electricians) can be present when one of the electrical switchgear cabinets is opened up for maintenance. The technicians performing the maintenance work are required to wear protective gloves, glasses, hard hats, or other safety gear.

At the same time, traditionally, lighting in high voltage rooms was often poor and typically uncontrolled. Such room lighting was not sufficient for the technician to comfortably see inside the cabinet once the cabinet door is opened during the time that a technician may be performing repairs or maintenance. Recently, smart lighting systems have been proposed. One such system is described in U.S. patent application Ser. No. 15/833,087, filed on Dec. 6, 2017, entitled, "Sensing and Alert System for Electrical Switchgear," which discloses a sensing and alert system with time of flight (ToF) sensors and lighting modules installed inside each switchgear cabinet. As one of the safety features provided by the sensing and alert system, the lighting module illuminates an inside portion of the cabinet in response to the ToF sensor detecting that the cabinet door was opened.

SUMMARY OF THE INVENTION

Personnel, such as facility managers, responsible electrical switchgear cabinets are often responsible by law for enforcing safety procedures, including controlling and restricting access to the electrical switchgear cabinets during maintenance. However, the relevant electrical codes specifying this requirement do not provide details about how such a procedure should be implemented or enforced. Thus, there is a need for a system to aid facility managers in ensuring that only qualified individuals have access to an environment where maintenance work is being performed on electrical switchgear cabinets and there are adequate warnings for others.

It would also be desirable to signal to other individuals such as occupants of nearby premises or even remote sites linked to the site under maintenance that maintenance work on the switchgear cabinets is in progress. It is additionally useful to log the time and date of maintenance events (e.g. when the switchgear cabinet doors were opened).

One major problem for developing solutions that apply to existing electrical switchgear installations is the fact that these industrial cabinets are UL listed, resulting in a requirement that any mechanical or electrical added equipment, including equipment used to signal the cabinet state might void the UL compliant status of the cabinets. Because of the stringent UL specifications, it is difficult to retrofit safety features into existing electrical cabinets. For example, such UL specifications do not permit drilling into the cabinet for any reason to attach components. For this reason a different, novel approach is required for any safety upgrade.

According to the present invention, a safety system for high-voltage electrical cabinetry is proposed in which active visual and/or audible warnings are presented when maintenance is ongoing. The system uses the existing switchgear cabinet infrastructure, particularly an automatic lighting infrastructure with a dedicated lighting power circuit, to signal a cabinet maintenance status information (e.g. under maintenance or normal operating conditions) based on whether the cabinet door is open or closed, which is determined based on whether the cabinet lamps are on or off. Assuming that an idle current of the lighting power circuit when all of the lamps are off is smaller than the current used by the lamp with the lowest current consumption connected to the monitored circuitry, the system can monitor the electrical load (e.g. current consumption) of the lighting circuit and trigger signaling devices when at least one lamp is turned on. The signaling devices, in turn, present the status information to individuals in different signaling areas, which might include an area outside a door to a room containing the electrical switchgear cabinets, areas at remote sites linked to the site under maintenance, or even within the room containing the cabinets.

The system can be retrofit for existing electrical switchgear cabinetry. A non-intrusive lighting circuit load monitor can evaluate the electrical load for the lighting circuit without requiring electrical contact with a conductor of the lighting circuit. The signaling circuitry works independently and is completely insulated from the lamp circuitry.

In one embodiment, for example, a current sensor (current transformer or hall sensor) might be hooked or magnetically coupled to the lamp circuitry (with no electrical connection). The current sensor would output a voltage proportional with the detected electrical load for the lighting circuit. The evaluated electrical load of the lighting circuit (e.g. the measured current passing through conductors of the lighting circuit) is rectified (in case the lamp circuitry uses AC power), amplified and then compared to a reference value.

In an idle state (with all cabinet doors closed), the voltage, as result of processing of the current value, would be less than the reference value. In this case, a signal driver sets the polarity of a signaling bus providing power to signaling elements (e.g. lights, annunciators, speakers) to be positive (for DC buses) or positive, half-rectified (for AC buses), causing a green optical indicator to turn on.

On the other hand, when one of the cabinet doors is opened, the associated lamp is turned on via the automatic lighting system, and the current passing through conductors of the lighting power circuit increases and exceeds a set threshold. As a result, the signal driver will reverse the voltage polarity on the signaling bus, causing a red optical indicator to turn on and/or flash.

Regarding the optical indicators, the simplest optical indicator can have two lamps or light-emitting diodes (LED) in parallel, both connected with two series diodes in different directions. When applying a positive voltage on the signaling bus the green light turns on, and when applying a negative voltage, the red light turns on.

The signaling elements can be hosted in a common electrical box close to a restricted area access door or in a visible place when placed in a power generators room, to name a few examples.

In another embodiment, a common power supply is used for powering the signaling bus and the lighting circuit. In this case, a shunt can be used to measure the current of the lighting circuit, for a simpler design. The common power circuit would have a relatively low DC voltage (e.g. 24V) that would not represent an electroshock hazard and thus not require passing additional safety regulation and/or obtaining extra certification. The signaling driver would have its own overcurrent protection circuitry in order to avoid situations when a signaling bus short affects the lighting circuitry and causes cabinet lamps to turn off while the cabinets are under maintenance. This embodiment can also send maintenance event information to a monitoring center via a PLC. Another feature is the possibility to connect multiple bridge modules, each with its own load monitor evaluating the electrical load of a lighting circuit for a different group of cabinets. The bridge modules would share a single signaling bus through a bridge signal. The signaling bus will be triggered when at least one of the bridge modules is triggered by an open cabinet door. On the other hand, the PLC would be able to discriminate between the groups and determine in which group of cabinets the maintenance event was detected.

Another feature could be the inclusion of the sound indicators, which are connected on the same signaling bus where the red-green state signaling lamps are connected. The sound indicators might have an optional backup battery that is used to signal a bus fault (e.g. when there is no voltage across the signaling bus). The sound indicator has a logic control block that detects the bus polarity state (normal or reverse) and a polarity change sequence (e.g. from normal to reverse or reverse to normal). If the bus polarity is reversed, a passive infrared (PIR) or radiofrequency (RF) doppler motion detector detects any movement in an area surrounding the sound indicators.

In one example, when a person is approaching the entrance door of an access restricted area during a maintenance status, a warning message (e.g.: "stop", "do not enter", "site under maintenance") is played. The message is repeated until the movement stops, at which point only the red lamp alert remains active until the maintenance is finished (e.g. all cabinets are closed).

In another example, when the system is restored to normal operating conditions (e.g. when the signaling bus polarity changes from reversed to normal) a message might be played, announcing that the site is safe to enter.

The sound indicators would include nonvolatile memory (e.g. an SD card) will store different sets of messages in different languages (e.g. English, French or Spanish). An initial language selection would be done at installation using a set of jumpers, and the selected language version of the messages would be played.

In general, according to one aspect, the invention features a signaling system for electrical switchgear cabinets. The signaling system comprises one or more indicators, one or more load monitors, and one or more signal drivers. The indicators present status information (e.g. indicating a normal operating status and/or a maintenance status for the electrical switchgear cabinets) to persons. The load monitors evaluate an electrical load for one or more power circuits providing power to lamps used to illuminate the electrical switchgear cabinets. The signal drivers drive the indicators to present the status information based on the evaluated electrical load.

In embodiments, each of the lamps is associated with and located within a single one of the electrical switchgear cabinets. The lamps automatically turn on when a door of the associated electrical switchgear cabinet is opened.

The system might include a comparator for comparing the evaluated electrical load with a predetermined reference value. The signal driver drives the indicators based on whether the evaluated load indicates that at least one of the lamps is turned on, which, for example, might be determined based on the comparison between the electrical load and the reference value. The reference value would be configured to be less than an expected electrical load when at least one lamp is turned on.

The load monitor might include a current detector, a current transducer, a current transformer and/or a Hall effect sensor for measuring an electrical current.

The indicators could be light indicators or sound indicators. The light indicators emit light via one or more colored LEDs. The sound indicators emit sound via one or more annunciators or play audible messages via amplifiers and speakers. Different messages would be played based on signals from the signal driver. Motion detectors of the sound indicators might detect the presence of individuals within signaling areas in proximity to the sound indicators, in which case controllers of the sound indicators would determine the intended messages to be played based on whether someone was detected. The sound indicators would further include a multi-language speech engine for selecting between different language versions of the messages based on a preconfigured language setting. These audible messages would be stored in nonvolatile storage of the sound indicators.

The indicators could present the information to persons within or outside a room containing the switchgear cabinets. One example might be an area surrounding an access point providing access to the room containing the switchgear cabinets. In another example, the indicators present the status information to persons located at a remote premises different from a premises containing the electrical switchgear cabinets.

One or more attachment mechanisms might secure the current detector in a position in close proximity to and/or in contact with an exterior surface of an insulation layer surrounding a conductor of the power circuits. Such an attachment mechanism would enable the load monitor to evaluate the electrical load without requiring electrical contact between the load monitor and the conductor.

The system might include one or more signaling buses providing connectivity between the signal drivers and the indicators driven by the signal drivers. The signal driver would drive the indicators connected to the same signaling bus as the signal driver by setting a voltage across the signaling bus with either a first or a second polarity. The first polarity would represent the normal operating status and the second polarity would represent the maintenance status. The indicators could include two diodes and two lamps. The first diode would direct a current to power the first lamp when the voltage across the signaling bus has the first polarity. The second diode would direct a current to power the second lamp when the voltage across the signaling bus has the second polarity.

In one embodiment, the system might have a plurality of bridge modules electrically connected to each other via a bridge bus. Each bridge module would be associated with a different group of electrical switchgear cabinets and would comprise a load monitor and a signal driver. The load monitor of each bridge module would evaluate the electrical load for a group power circuit providing power to the lamps illuminating the group of cabinets to which the bridge module is associated. Each bridge module could send group status signals over the bridge bus to the other bridge modules based on the evaluated electrical load for its respective group power circuit. The signal drivers drive the indicators based on combined group status signals received from all of the bridge modules via the bridge bus. In this example, the bridge modules would receive power from a combined signaling and lighting power supply, with each bridge module relaying the power to the lamps for their associated group. The bridge modules would comprise output ports for sending the group status signals to an external programmable logic controller (PLC). The PLC would generate maintenance event information based on the group status signals, including time and date information, status information, and group identification information, and send the event information to a monitoring center.

In general, according to another aspect, the invention features a method for presenting maintenance status information for electrical switchgear cabinets. An electrical load for one or more power circuits providing power to lamps for illuminating the electrical switchgear cabinets is evaluated. Status information indicating a normal operating status and/or a maintenance status for the cabinets is then presented based on the evaluated electrical load.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1A:
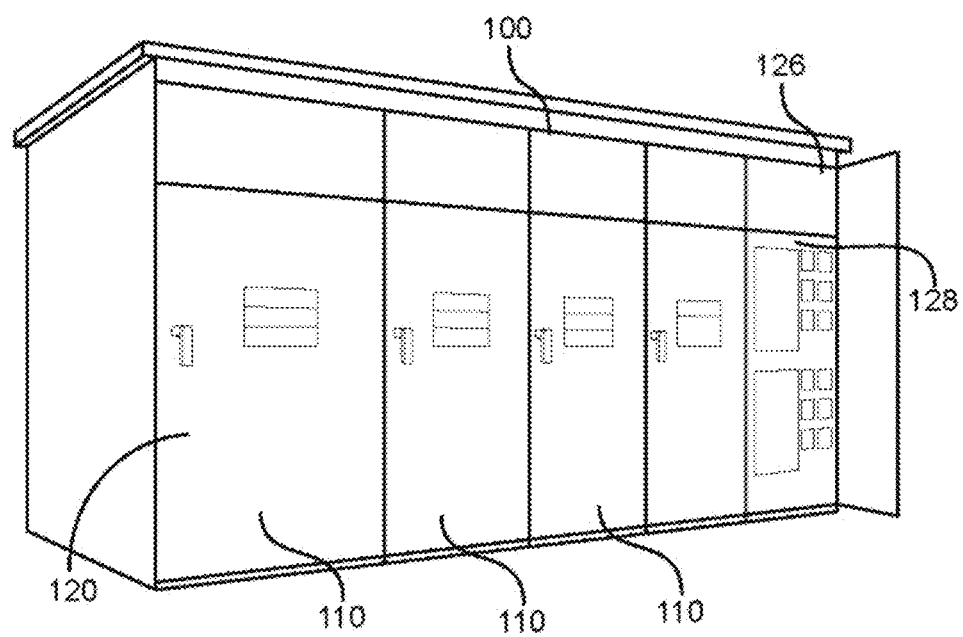
FIG. 1A is a perspective view of a typical electrical switchgear cabinet system to which the present invention is applicable.

FIG. 1A illustrates a typical electrical switchgear cabinet system 100 to which the present invention is applicable. The electrical switchgear cabinet system 100 includes one or more high-voltage switchgear cabinets 110, each having one or more high-voltage power conducting elements (e.g. circuit breakers, fuses, switches, lightning arrestors) disposed internal to the cabinet 110 and protected by a lockable door 120. Typically these high-voltage circuit breakers switch circuits operating above 1000 Volts (V) for alternating current, and at least 1500 V for direct current. However, the term "high-voltage" for the purposes of the presently disclosed system can be understood to include any voltage high enough to inflict harm on living organisms, typically including 600 V or greater.

A control cabinet 126 houses a control system, which may be a central programmable logic controller (PLC) 128. The central PLC 128 may control one or many switchgear cabinets 110. For purposes of clarity only four switchgear cabinets 110 are shown, but any suitable number of switchgear cabinets may be included in the electrical switchgear system 100 depending upon the size of the installation and the particular application.

Additionally, in the preferred embodiment, the electrical switchgear cabinet system 100 is assumed to have an automatic lighting system installed. The lighting system includes a dedicated lighting power circuit providing power to lamps, each of which illuminates the inside of a different electrical switchgear cabinet 110 when the door 120 for that electrical switchgear cabinet 110 is opened. The automatic lighting system might detect the opening of the door 120 to the electrical switchgear cabinet 110 in a number of ways. In one example, a time of flight (ToF) sensor inside each cabinet 110 detects when the cabinet door 120 is open. Other examples include mechanical switches that are opened or closed when the cabinet doors are opened or proximity sensors.

Figure 1B:
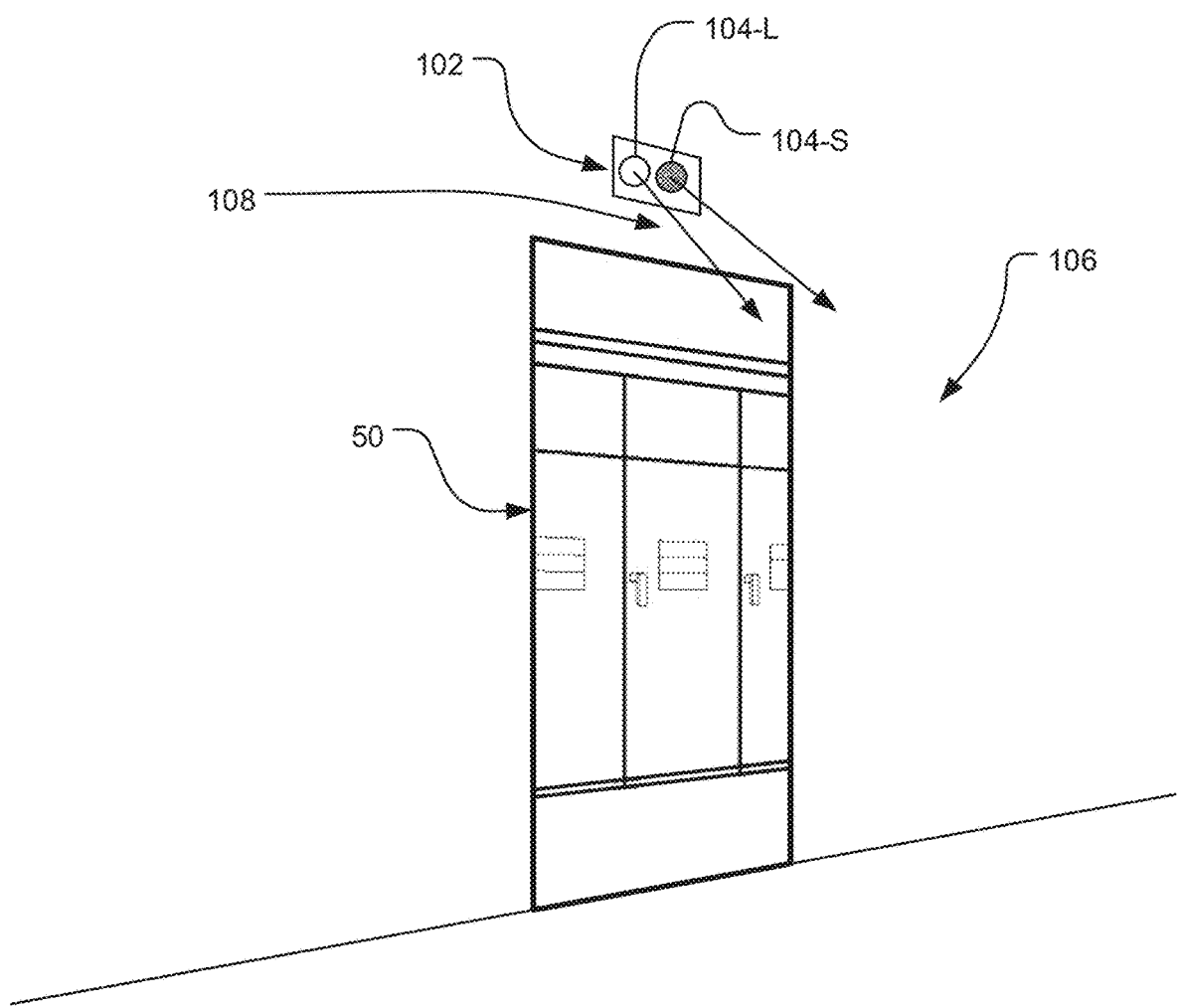
FIG. 1B is a perspective drawing of a signaling system for the electrical switchgear system according to one embodiment of the present invention.

FIG. 1B is a perspective drawing of a signaling system 102 for the electrical switchgear cabinets 110 according to one embodiment of the present invention.

In general, the signaling system 102 presents status information 108 to persons within a signaling area 106 via one or more indicators 104 of the signaling system 100. The indicators 104 include light indicators 104-L, which present the status information by emitting light via colored light-emitting diodes (LEDs), and sound indicators 104-S, which present the status information by emitting sounds via annunciators and/or speakers.

The status information 108 (e.g. light or sound emitted by the indicators 104) pertains to the maintenance status of the electrical switchgear system 100. In one example, the status information 108 indicates a normal operating status and/or a maintenance status of the electrical switchgear system 100. The normal operating status would be indicated when the electrical switchgear system 100 is operating normally and no maintenance work is being performed. On the other hand, the maintenance status would be indicated when the electrical switchgear system 100 is undergoing maintenance work.

The signaling area 106 is the area where the signaling system 102 is located and where the status information 108 is presented. Importantly, the signaling area 106 is typically not the same area as an area where the electrical switchgear cabinets 110 are located, as one purpose of the signaling system 102 is to restrict access to the area containing the electrical switchgear cabinets 110. As a result, a common location for the signaling system 102 and the signaling area 106 would be outside a room containing the electrical switchgear cabinets 110, presenting the status information 108 within an area surrounding an access point 50 providing access to the room containing the switchgear cabinets 110, as presented in the illustrated example. In other examples, the signaling area 106 might be at a remote premises (e.g. building or site) different from a premises containing the electrical switchgear cabinets 110 but linked to the site under maintenance (e.g. in a power generator room or close to a critical load), or even within the room containing the cabinets 110.

The signaling system 102 determines the maintenance status of the electrical switchgear system 100 based on whether any of the doors 120 of the electrical switchgear cabinets 110 are open. For example, in electrical switchgear systems 100 that include the previously described automatic lighting system, the opening of one or more of the doors 120 would result in one or more lamps being turned on to illuminate the inside of the electrical switchgear cabinets 110. An electrical load (e.g. current consumption) of the lighting power circuit would change based on the number of lamps turned on. When the electrical load indicates that one or more of the lamps are turned on, it can be inferred that maintenance work is being done, as the doors 120 of the electrical switchgear cabinets 110 are kept closed during normal operating conditions.

Figure 2:
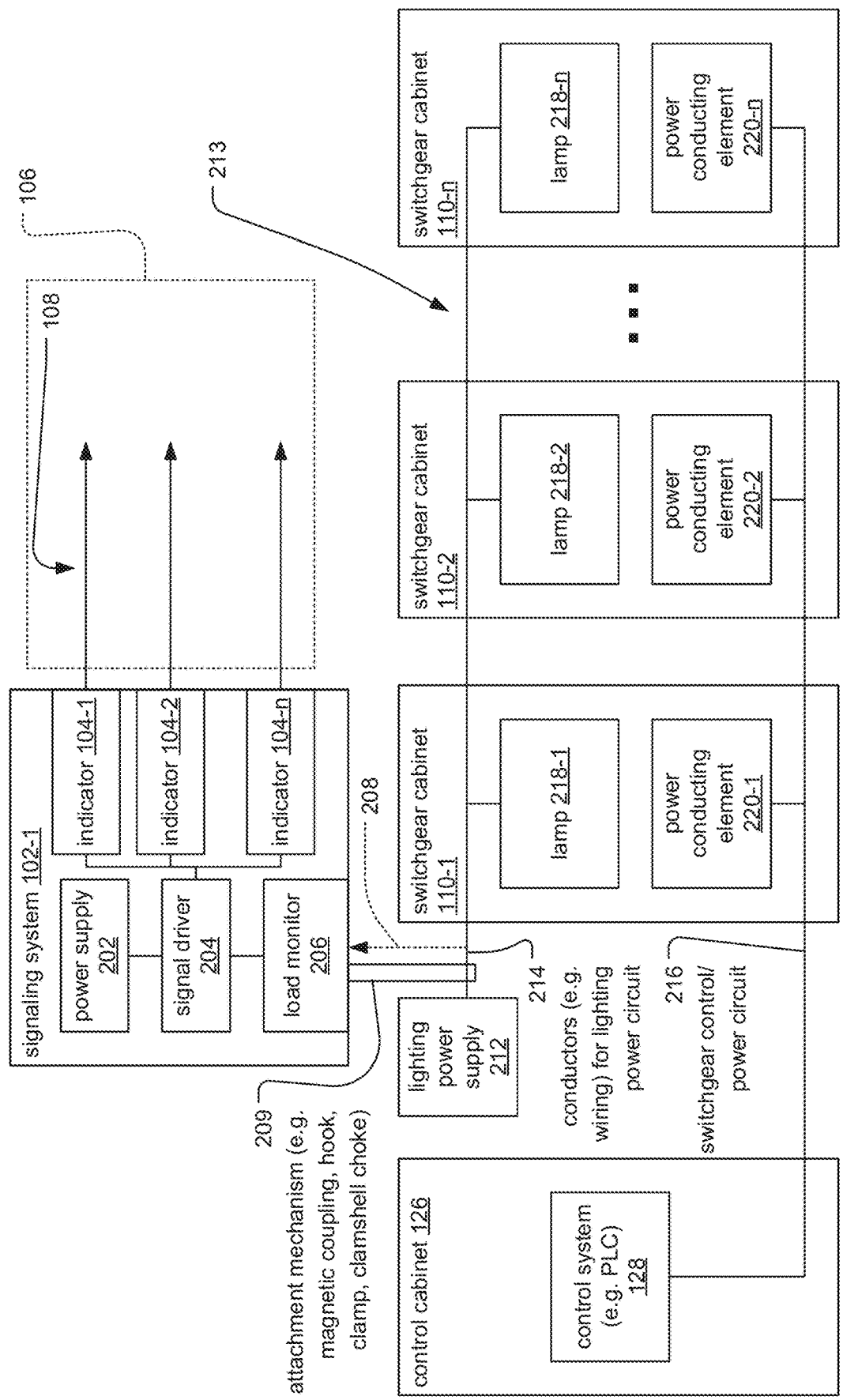
FIG. 2 is a block diagram of the signaling system according to one embodiment of the invention.

FIG. 2 is a block diagram of the signaling system 102-1 according to one embodiment of the invention.

In the illustrated example, the signaling system 102-1 is shown along with the electrical switchgear system 100 for which the signaling system 102-1 presents the status information and the automatic lighting system providing illumination of the electrical switchgear cabinets 110.

As previously described with respect to FIG. 1, the control cabinet 126 houses the control system 128, which controls power conducting elements 220 (e.g. circuit breakers, fuses, switches, lightning arrestors) of the electrical switchgear cabinets via a switchgear control/power circuit 216. The control cabinet 126 may further house various transformers that provide low voltages, e.g., 24 V DC, which is the preferred voltage level for the central PLC 128 and associated control signals. The 24 V DC signal may be provided by the control cabinet 126 to each high-voltage switchgear cabinet 110 in a daisy-chain manner from cabinet to cabinet using standard wiring. Use of 24 V DC control signaling is preferable because 24 V is sufficiently low so as not to present a shock hazard if inadvertently touched by a human, yet sufficiently high so as to be resistant to electrical noise and other induced or stray radiation, to ensure an acceptable current drop over the span of the circuit and to allow for thinner wiring for the circuit. A battery backup system (not shown) may also provide the 24 V DC power to the components.

In parallel, a lighting power supply 212 provides power to a series of lamps 218 associated with each of the electrical switchgear cabinets 110 via a lighting power circuit 213. The lighting power circuit 213 includes one or more conductors 214 (e.g. wires) for conducting electrical current to the lamps 218. The lamps 218 for different cabinets 110 can differ with respect to each other (e.g. using different lighting technology, different electrical loads, lighting intensity) and still be connected to the same lighting power circuit 213. Regardless of which type of lamp 218 is used, the lamps 218 are configured to turn on when the doors 120 to the electrical switchgear cabinets 110 in which the lamps 218 are installed are opened and to turn off when the doors 120 are closed, such that an on/off state for the lamp 218 depends on an open/close state of the door 120. In the illustrated example, the lighting power supply 212 is shown outside of the control cabinet 126. However, in embodiments, the lighting power supply 212 might be inside the control cabinet 126, and the lamps 218 could even receive power from the control cabinet 126 (for example, from one of the previously mentioned transformers providing 24 V DC).

While, according to the preferred embodiment, the switchgear control/power circuit 216 and the lighting power circuit 213 provide 24 V DC power, for either circuit, 36 V, 48 V and even 125 V DC power could also be used.

The signaling system 102-1 includes a load monitor 206, a signal driver 204, a power supply 202, and a series of indicators 104.

The power supply 202 provides power to the other components of the signaling system 102-1.

The indicators 104 present the status information 108 to persons within the signaling area 106, as previously described.

In general, the load monitor 206 evaluates an electrical load 208 (e.g. current consumption) for the lighting power circuit 213 and detects when one or more of the lamps 218 are turned on. As the lamps' 218 consumption of power can be profiled in a detectable way, the evaluated electrical load 208 of the lighting power circuit 213 can be used to determine whether one or more of the lamps 218 are turned on. In one embodiment, the load monitor 206 might include a current detector for measuring the electrical current passing through the conductors 214 of the lighting power circuit 213. The current detector might include a current transducer, a current transformer and/or a Hall effect sensor. Although according to one embodiment, the load monitor 206 evaluates the electrical load 208 non-intrusively, in other embodiments, the load monitor 206 could include a shunt (e.g. a resistor in series with one of the conductors 214), and/or it could include a mechanism for piercing an insulation layer surrounding the conductor at two points, among other examples.

For example, when none of the lamps 218 are turned on, the lighting power circuit 213 is in an idle state, with a no or a relatively low amount of electrical current passing through the conductors 214 of the lighting power circuit 213. When one or more of the lamps 218 is turned on, the lighting power circuit 213 is in an on state, with a relatively high amount of electrical current passing through the conductors 214. The number of lamps 218 that are turned on would result in a proportionate increase in the current passing through the conductors 214 of the lighting power circuit 213. However, as it can be inferred that the electrical switchgear system 100 is undergoing maintenance when only a single lamp 218 is illuminated, a threshold value for determining the idle or on state of the lighting power circuit 213 need only be higher than a value proportional to the expected electrical load (e.g. measured current) during the idle state and lower than a corresponding value for the expected electrical load when a single lamp 218 is turned on. In cases where different types of lamps 218 are connected to the same lighting power circuit 213, the threshold would need to be lower than the expected electrical load when a single lamp 218, of a type having the lowest consumption of electrical current with respect to the other types of lamps 218, is turned on.

The signal driver 204 drives the indicators 104 based on the evaluated electrical load 208 of the lighting power circuit 213. In one example, when the evaluated electrical load 208 indicates that one or more of the lamps 218 are turned on, the signal driver 204 causes the indicators 104 to present status information indicating the maintenance status. In another example, when the evaluated electrical load 208 indicates that none of the lamps 218 is turned on, the signal driver 204 causes the indicators 104 to present status information indicating the normal operating status.

The signaling system 102-1 also includes an attachment mechanism 209, which secures the load monitor 206 in a position in close proximity to and/or in contact with an exterior surface of the insulation layer surrounding the conductor 214. The attachment mechanism enables the load monitor 206 to evaluate the electrical load without requiring electrical contact between the load monitor 206 and the conductor 214. The attachment mechanism 209 might include magnetic coupling mechanisms, hooks, clamps, and/or clamshell splices, among other examples. Another example is a T-splice, using a tap wire splice connector, that connect the end of one tap wire 209 to the middle of another main wire 214

Figure 3:
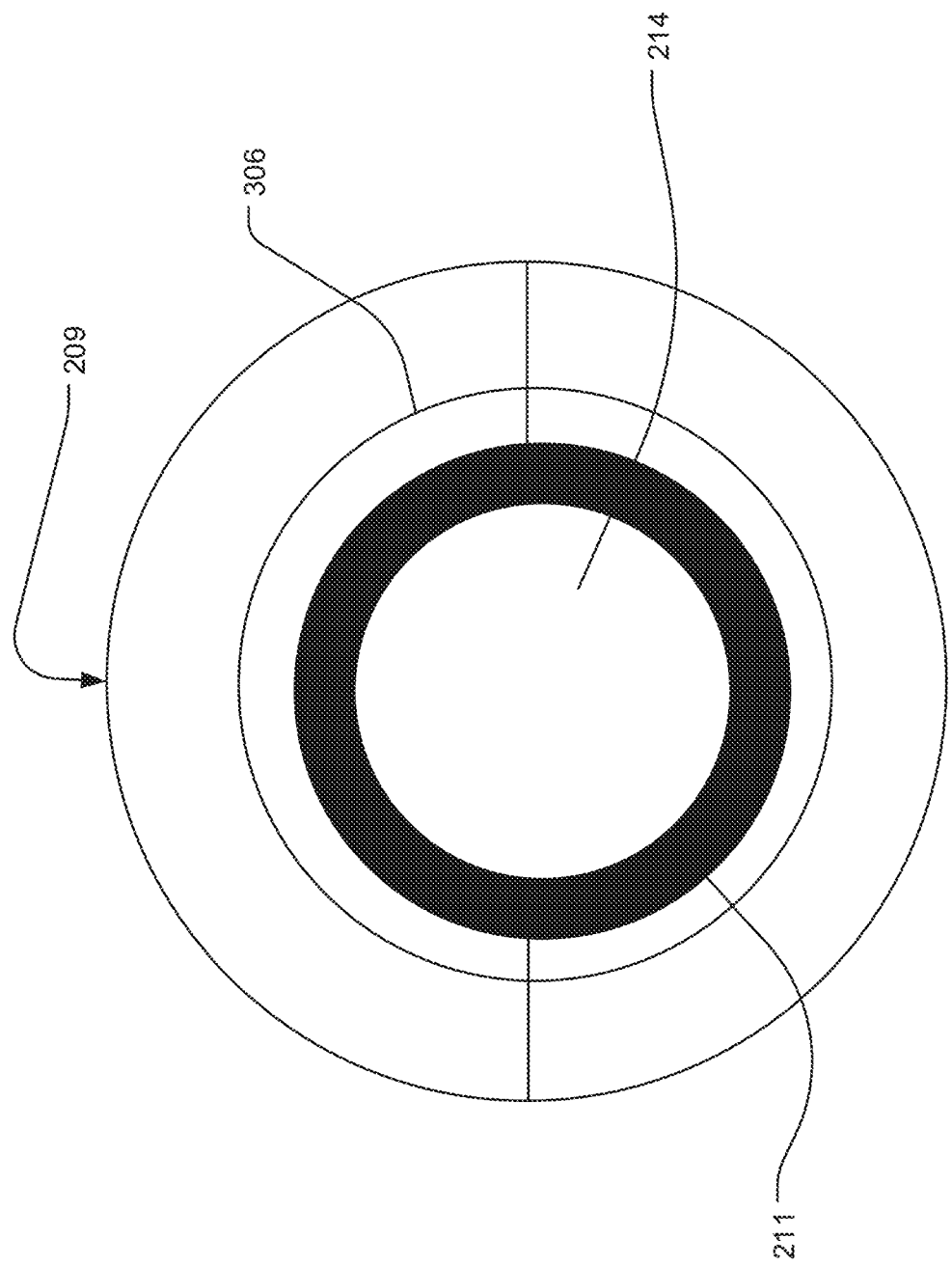
FIG. 3 is a cross sectional view of an exemplary attachment mechanism of the signaling system.

FIG. 3 is a cross sectional view of an exemplary attachment mechanism 209 securing a current detection element 306 (e.g. current transducer) of the load monitor 206 to one of the conductors 214 of the lighting power circuit 213. In another example, an electrical splice could be made by piercing through the insulation 211 with a metal tooth. In the illustrated example, the attachment mechanism 209 is a clamshell connector surrounds the conductor 214 and positions the current detection element 306, which might form the interior surface of the cylindrical clamshell in contact with an exterior surface of the insulation layer 211 of the conductor 214. The clamshell 209 might include one or more clips or locking mechanisms to hold the clamshell 209 closed around the conductor 214. In any event, the current detection element 306, only comes in contact with the exterior surface of the insulation layer 211 without penetrating the insulation layer 211 or coming in electrical contact with the conductor 214. In this way, the load monitor 206 non-invasively evaluates the electrical load of the lighting power circuit 213, for example, by detecting and measuring the current passing through the conductor 214.

Figure 4:
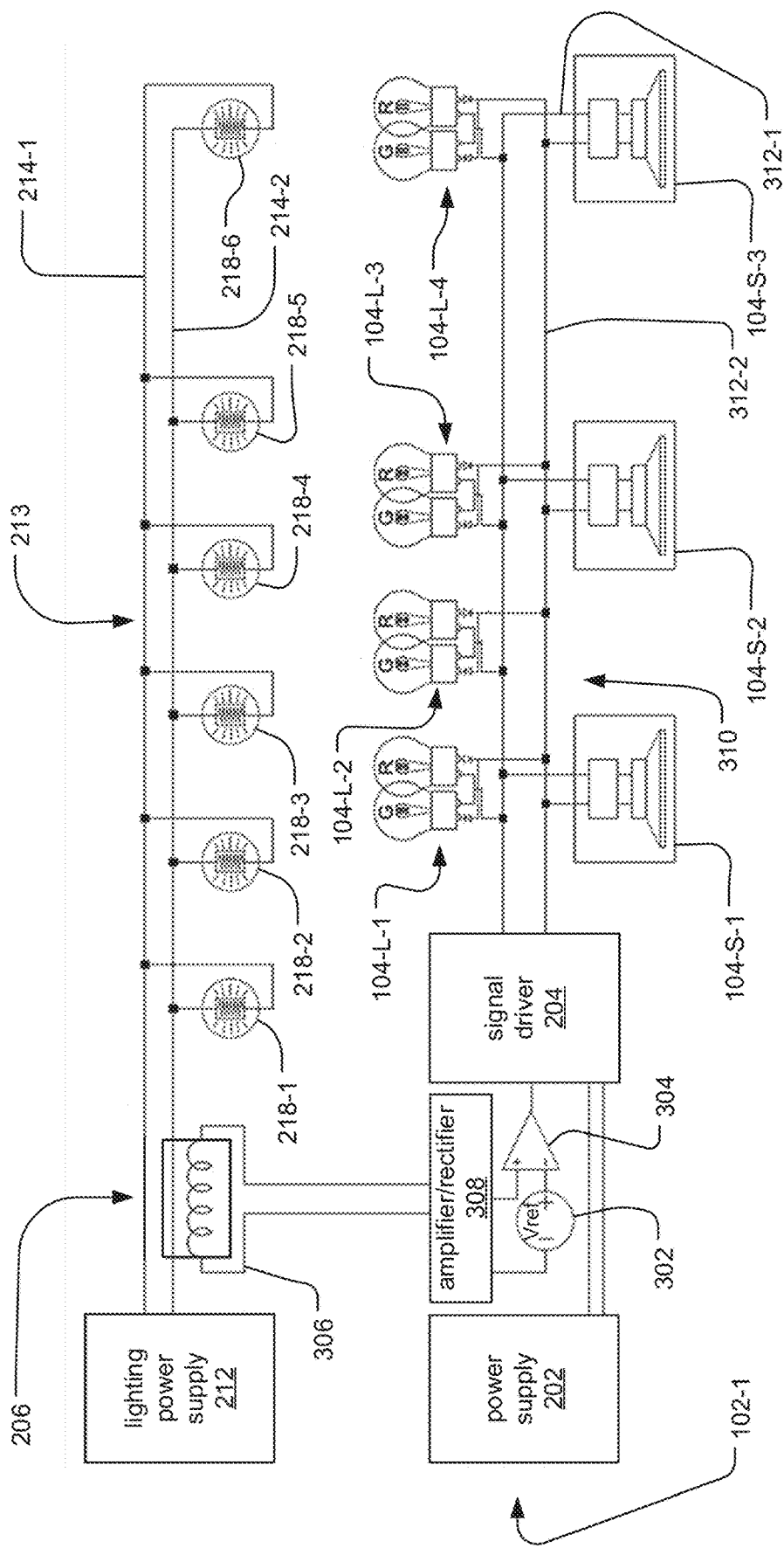
FIG. 4 is a circuit diagram of the signaling system according to one embodiment of the invention.

FIG. 4 is a circuit diagram of the signaling system 102-1 according to one embodiment of the invention. As previously described, the lighting power supply 212 provides power to the lamps 218 via the conductors 214 of the lighting power circuit 213, and the signaling system 102-1 includes the power supply 202, the signal driver 204, the load monitor 206, and the indicators 104.

Here, however, the components are shown in more detail.

In particular, the lighting power circuit 213 includes a live conductor 214-1 and a neutral conductor 214-2. The neutral conductor 214-2 is the return conductor of the lighting power circuit 213 carrying current back to the power supply 212, whereas the live conductor 214-1 delivers electrical current to the six lamps 218-1 through 218-6 via electrical potential with respect to the neutral conductor 214-2. The circuit for lamps 218-1 through 218-6 would typically include additional components associated with the automatic lighting system, which are not shown in the illustrated example. The additional components might include switches to determining the open/closed state of the door 120 of the cabinet 110 in which each lamp 218 is installed so that the lamps are automatically turned-on when the respective door is opened.

The load monitor 206 includes an amplifier/rectifier 308, a comparator 304, a reference voltage 302, and the current detection element, which in the illustrated example, is a current transducer or winding 306. This basic configuration works for an AC circuit.

In the case of a DC circuit, other configurations might be used. For example, a conventional DC current probe can be employed. In one such example, the current carrying wire is passes through a core, which has a secondary winding. The secondary winding functions as a compensation coil. An air gap in the core holds a sensor, e.g. a hall-sensor, which measures the magnetic flux in the core. Thus, the current in the wire will magnetize the core. This magnetic field is measured with the sensor and as a result of this, a control circuit runs a current through the compensation winding in a way that the magnetic flux in the core is kept zero. As a result of this the core will never be magnetized. The advantage is that the non-linear properties and hysteresis of both the core and the magnetic sensor have little influence on the measurement results.

The current transducer 306 measures the electrical current passing through one of the conductors 214 of the lighting power circuit 213. In the illustrated example, the current transducer 306 measures the current passing through the neutral conductor 214-2, but the current for either one of the conductors could be measured. The current transducer 306 outputs a signal representing the measured current 208.

The amplifier/rectifier 308 amplifies the signal from the current transducer 306, for example, to a voltage level expected by the comparator 304. The amplifier/rectifier 308 might also rectify the signal (e.g. if the measured current 208 is AC). A capacitor could be further added to add hysteresis.

The comparator 304 compares the signal representing the measured current 208 to the reference voltage 302, which would generally correspond to a threshold for determining whether one or more of the lamps 218 is turned on. For example, the reference voltage 302 might correspond to a value greater than a proportional value representing the expected current when the lighting system is in the idle state but less than the value for the expected current when the lighting system is in the on state. The comparator 304 signals the signal driver 204 based on this comparison.

The signal driver 204 controls a signaling bus 310 for providing power and controlling the indicators 104. The signaling bus 310 includes a first conductor 312-1 and a second conductor 312-2, either of which can be the live conductor or the neutral conductor depending on the state of the signaling bus 310. The signal driver 204 controls the polarity of the voltage across the signaling bus 310 by setting either a normal (e.g. positive) polarity or a reversed (e.g. negative) polarity. For example, when the signal driver 204 sets the polarity of the signaling bus 310 to its normal state, the current might flow through the conductors 312 in a first direction, with the first conductor 312-1 being the live conductor and the second conductor 312-2 being the neutral conductor. On the other hand, when the signal driver 204 sets the polarity of the signaling bus 310 to its reversed state, the current might flow through the conductors 312 in a second direction opposite to the first direction, with the second conductor 312-2 being the live and the first conductor 312-1 being neutral. The signal driver 204 controls the polarity of the signaling bus 310 based on the signal output by the comparator. In one example, the normal polarity might correspond to the normal operating status of the electrical switchgear system 100, and the reversed polarity might correspond to the maintenance status.

This use of dual polarity allows for simplicity in design for the indicators 104. An additional benefit is the fact that, regardless of whether the signaling bus 310 has the first or the second polarity, an additional bridge can be provided to rectify the voltage so that standby power can be provided for more complex devices connected to the signaling bus 310, such as the sound indicator 104-S or other devices.

In the illustrated example, seven indicators 104 are shown, including four light indicators 104-L-1 through 104-L-4 and three sound indicators 104-S-1 through 104-S-3. Each of the indicators connects to both the first conductor 312-1 and the second conductor 312-2. In general, the indicators 104 will behave differently and present different status information 108 based on whether the polarity of the signaling bus 310 is normal or reversed.

Figure 5:
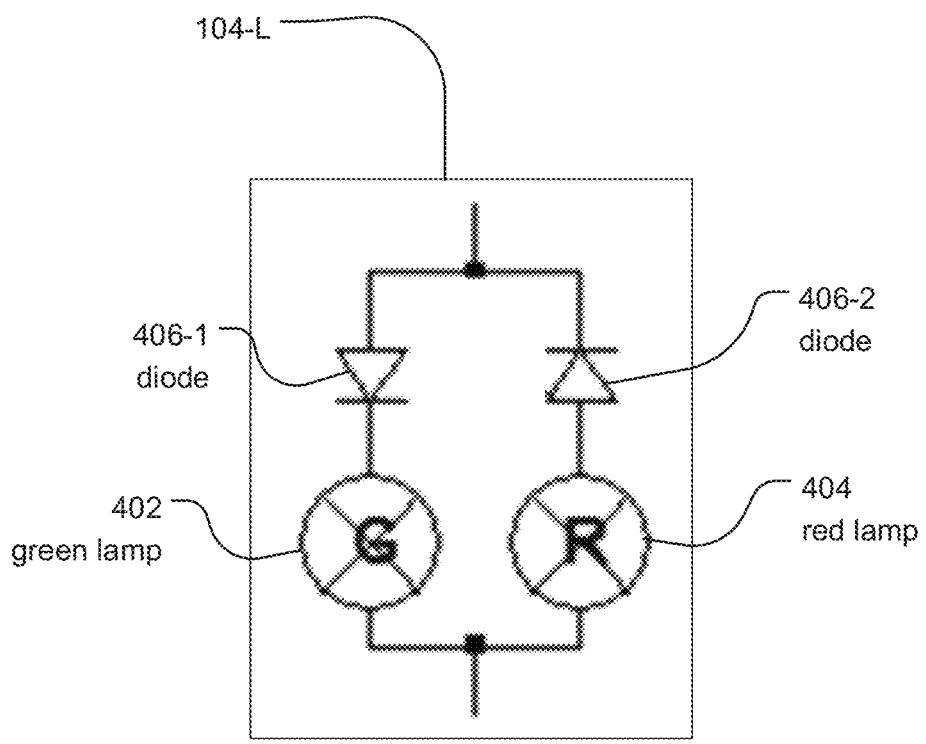
FIG. 5 is a circuit diagram of an exemplary embodiment of a light indicator of the signaling system.

FIG. 5 is a circuit diagram showing an exemplary embodiment of the light indicator 104-L. The light indicator 104-L includes a green lamp 402 and a red lamp 404 and two diodes 406-1 and 406-2. Diode 406-1 allows the current passing through the signaling bus 310 to power the green lamp 402 only when the voltage of the signaling bus 310 has a first polarity (e.g. positive or normal polarity). On the other hand, diode 406-2 allows the current passing through the signaling bus 310 to power the red lamp 404 only when the voltage of the signaling bus has a second polarity (e.g. negative or reversed polarity). The illustrated example shows functionality of the light indicator 104-L in presenting the status information. However, the light indicator 104-L could include additional features, including an electrical structure providing fault redundancy, for example.

Figure 6:
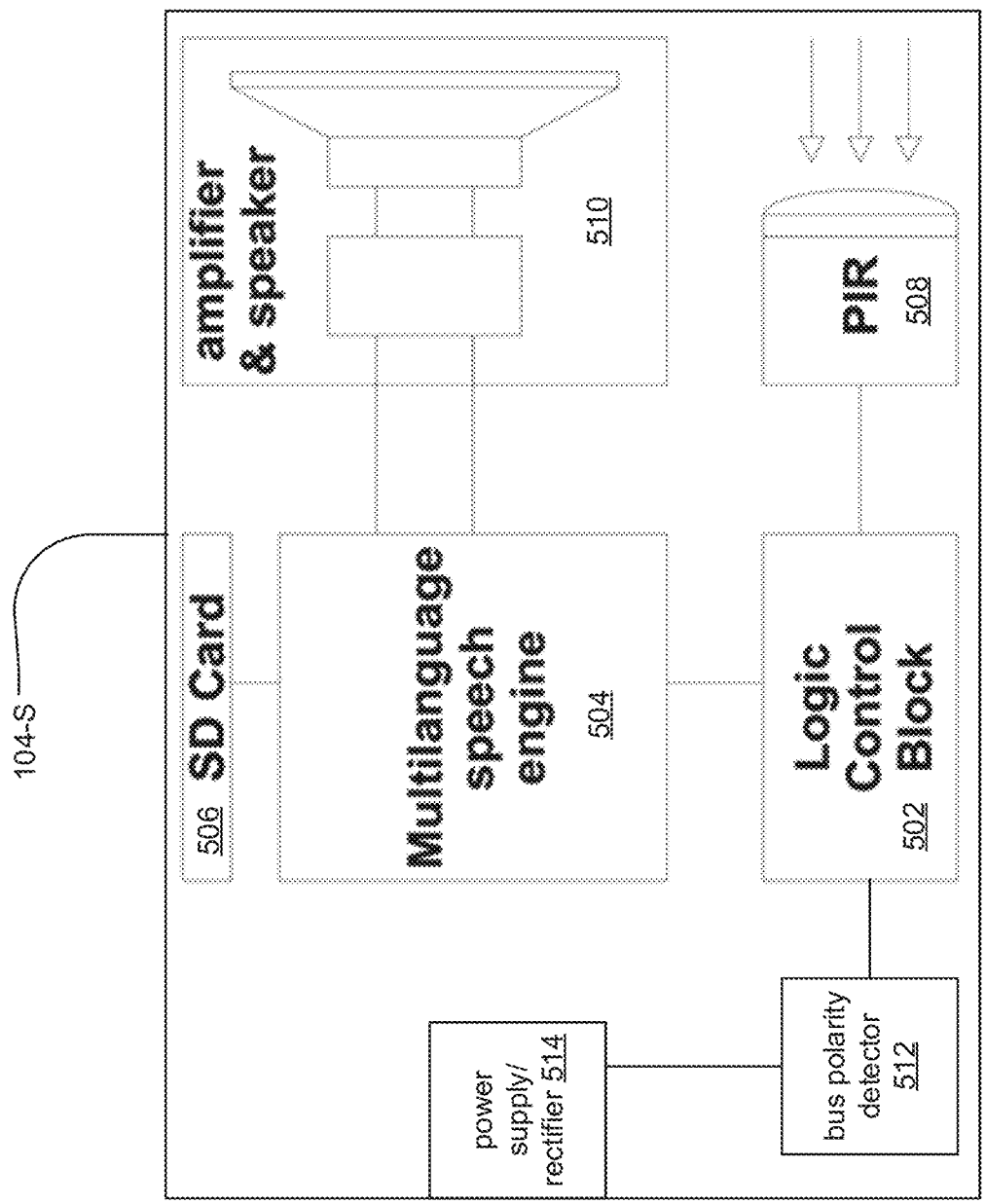
FIG. 6 is a circuit diagram of an exemplary embodiment of a sound indicator of the signaling system.

FIG. 6 is a circuit diagram showing an exemplary embodiment of the sound indicator 104-S.

The sound indicator 104-S includes a controller 502, a power supply/rectifier 514, a bus polarity detector 512, a motion detector 508, nonvolatile memory 506, an amplifier/speaker 510, and a multi-language speech engine 504.

The power supply/rectifier 514 provides power from the signaling bus 310 to the other components of the sound indicator 104-S, possibly rectifying the current from the signaling bus 310 if the current is AC.

The bus polarity detector 512 determines whether the voltage across the signaling bus 512 has the normal polarity or the reversed polarity, signaling the controller 502 based on which polarity was detected.

The motion detector 508 detects motion, and thus the presence of persons, in the signaling area 106. In one embodiment, the motion detector 508 includes a passive infra-red (PIR) sensor which measures infrared (IR) light radiating from objects such as persons within a field of view of the sensor. The motion detector 508 signals the controller 502 based on whether the presence of persons in the signaling area 106 was detected.

In general, the controller 502 directs functionality of the sound indicator 104-S, for example, by executing firmware instructions. In one example, the controller 200 is small single-board computer. In other examples, the controller is a microcontroller unit or a system on a chip (SoC), including one or more processor cores along with memory and programmable input/output peripherals such as analog to digital converts and digital to analog converters. More specifically, the controller 502 determines an intended audible message to be played based on the polarity of the signaling bus 310 detected by the bus polarity detector 512 and on whether the presence of persons was detected by the motion detector 508.

The nonvolatile memory 506 stores audio data corresponding to all possible audible messages that might be played, including different versions of the audible messages in which the speech is in different languages such as English, Spanish or French, to name a few examples. In the preferred embodiment, the nonvolatile memory 506 is a removable Standard Digital (SD) card.

The multi-language speech engine 504 selects between the different language versions of the intended audible messages to be played based on a predetermined language setting. The language setting might be set during an initial configuration process, for example, using jumpers connected to different combinations of jumper pins arranged on the multi-language speech engine circuitry, with the different combinations representing the different languages. The multi-language speech engine 504 retrieves the audio data corresponding to the language version of the intended audible message to be played and presents the audio data via the amplifier/speaker 510.

The amplifier/speaker 510 emits sound based on the audio data. In the preferred embodiment, the emitted sound includes different audible messages, including speech sounds. These speech sounds communicate the status information 108, such as an indication that the electrical switchgear system 100 is undergoing maintenance and to not enter the area, or an indication that the electrical switchgear system 100 has resumed the normal operating status, and it is safe to enter the area.

Figure 7:
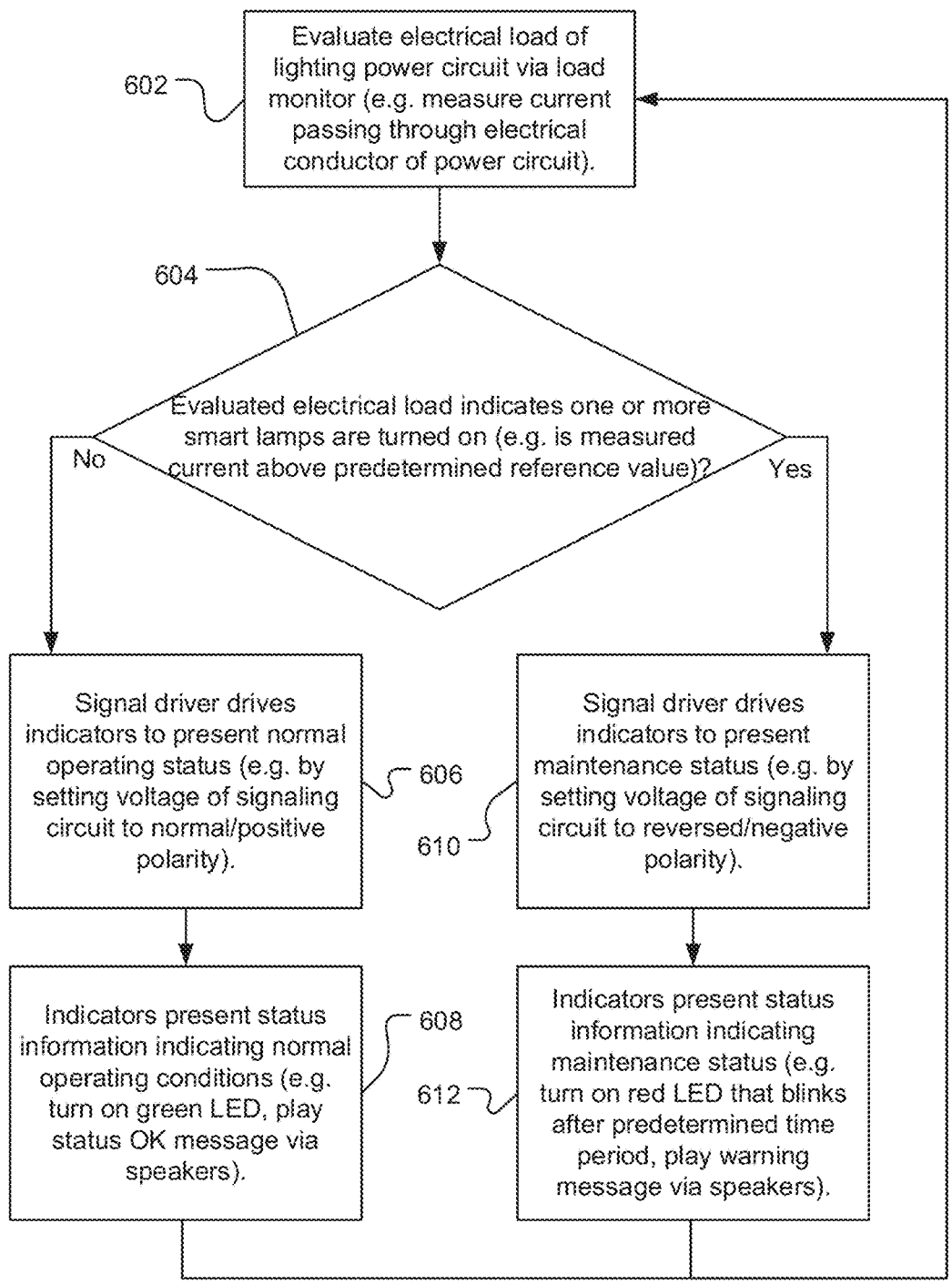
FIG. 7 is a flow diagram illustrating a process by which the signaling system presents status information based on an evaluated electrical load for a lighting power circuit.

FIG. 7 is a flow diagram illustrating the process by which the signaling system 102 presents the status information based on the evaluated electrical load 208 of the lighting power circuit 213 as determined by the load monitor 206.

First, in step 602, the load monitor 206 evaluates the electrical load of the lighting power circuit 213. In the preferred embodiment, the load monitor 206 measures an electrical current passing through one of the conductors 214 of the lighting power circuit 213 via the current detection element 306 such as a current transducer. The resulting evaluated electrical load 208 might be a signaled value representing the value of the measured current.

In step 604, it is determined whether the evaluated electrical load 208 indicates one or more of the lamps 218 are turned on. For example, if the evaluated electrical load 208 is the measured current passing through the conductor 214 of the lighting power circuit 213, as suggested above, it might be determined whether the measured current is above the predetermined threshold value, indicating that at least one of the lamps 218 is turned on.

If the evaluated electrical load 208 indicates that none of the lamps 218 are turned on (and thus the lighting system is in the idle state), in step 606, the signal driver 204 drives the indicators 104 to present status information indicating the normal operating status. For example, the signal driver 204 might set the voltage across the signaling bus 310 to the normal (e.g. positive) polarity. As a result, in step 608, the indicators 104 would present the status information indicating the normal operating status. For example, the light indicators 104-L would turn on the green lamps 402, and the sound indicators 104-S would play an OK status audible message (e.g. "It is now safe to enter.") via the amplifier/speakers 510.

On the other hand, if the evaluated electrical load 208 indicates that one or more of the lamps 218 are turned on (and thus the lighting system is in the on state), in step 610, the signal driver 204 drives the indicators 104 to present the status information indicating the maintenance status. For example, the signal driver 204 sets the voltage across the signaling bus 310 to the reversed (e.g. negative) polarity. As a result, in step 612, the indicators 104 present the status information indicating the maintenance status. For example, the light indicators 104-L turn on the red lamps 404 and cause the red lamps 404 to blink for the duration of the maintenance status or for a predetermined time period, and the sound indicators 104-S play a warning audible message (e.g. "Do not enter") via the amplifier/speakers 510.

In either case, the process returns to step 602 and repeats, as the signaling system 102 continuously monitors for changes to the status of the electrical switchgear system 100.

Figure 8:
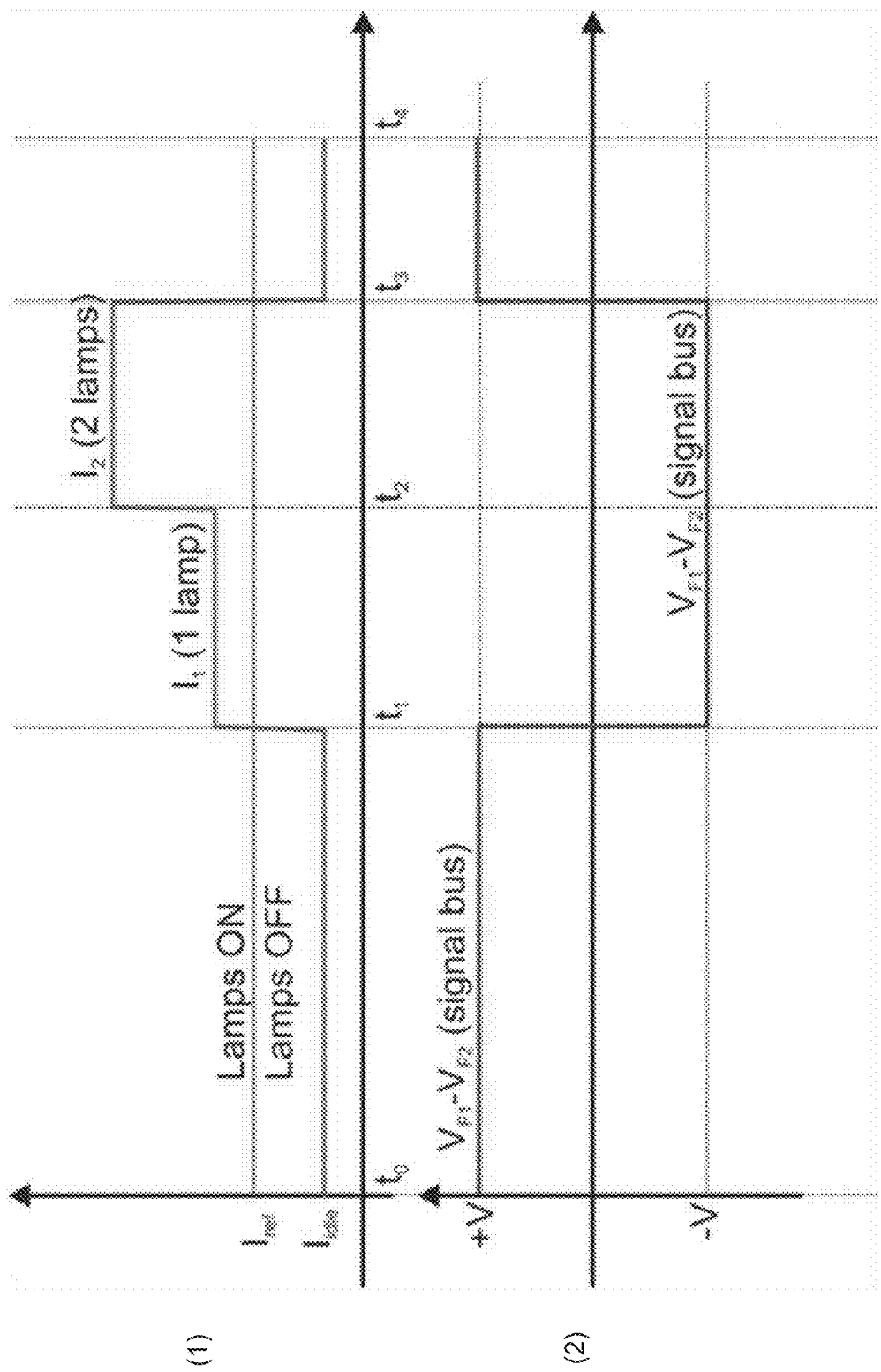
FIG. 8 is a series of graphs depicting corresponding values for the evaluated electrical load, a reference value, and corresponding changes to a voltage polarity of a signaling bus of the signaling system.

FIG. 8 is a series of graphs depicting corresponding values for the evaluated electrical load 208 of the lighting power circuit 213, the reference value and corresponding changes to the voltage polarity of the signaling bus 310 during an exemplary timespan. The x-axis for both upper graph (1) and lower graph (2) represent the same time values such that any point along the x-axis in the upper graph (1) corresponds to the same point along the x-axis of the lower graph (2), with both points corresponding to the same point in time.

The upper graph (1) shows changes to the evaluated electrical load 208, which is represented by the line of the upper graph labeled with $I_n$ for different times $t_n$ along the exemplary timespan represented by the x-axis of the graph. The y-axis of the upper graph (1) represents values of the evaluated electrical load 208, which might be direct measured values, for example, of the current passing through the conductors 214 of the lighting power supply 213, or might be simply proportional to the evaluated electrical load 208. The two values that are labeled on the y-axis of upper graph (1) are $I_{idle}$, which is a value corresponding to an expected evaluated electrical load 208 when the lighting system is in the idle state, and $I_{ref}$, which is the predetermined reference value corresponding to the threshold for determining whether one or more of the lamps 218 of the lighting system are turned on.

The lower graph (2) shows changes to the voltage polarity of the signaling bus 310, which is represented by the line on the graph labeled as $V_{F1}$-$V_{F2}$. The y-axis of the lower graph (2) represents the voltage polarity state, which, for the purposes of the presently disclosed signaling system 102 can be limited to the normal state (e.g. positive), labeled as +V on the y-axis of the lower graph (2), and the reversed state (e.g. negative), labeled as −V on the y-axis.

In general, the voltage polarity of the signaling bus 310, represented on the lower graph by the line on the graph labeled as $V_{F1}$-$V_{F2}$, is changed from the normal state to the reversed state by the signal driver 204 based on changes to the evaluated electrical load 208 as determined by the load monitor 206.

More specifically, from time $t_0$ to $t_1$, the evaluated electrical load 208 maintains the value $I_{idle}$, indicating that the lighting system has been determined by the load monitor 206 to be in the idle state. For the same period of time, the voltage polarity remains at +V, as the signal driver 204 maintains a positive voltage polarity across the signaling bus 310 based on the evaluated electrical load 208 indicating that none of the lamps 218 are on.

From time $t_1$ to $t_2$, however, the evaluated electrical load 208 changes to an arbitrary value $I_1$, which is above the $I_{ref}$ threshold, indicating that the lighting system has been determined by the load monitor 206 to be in the on state. In this example, the value $I_1$ corresponds to the electrical load when one of the lamps 218 is turned on. For the same time period, the voltage polarity changes to −V, as the signal driver 204 sets the negative polarity based on the evaluated electrical load 208 indicating that one of the lamps 218 is on.

From time $t_2$ to $t_3$, the evaluated electrical load 208 increases again to the value $I_2$, which is still above the $I_{ref}$ threshold, indicating that the lighting system remains in the on state. The value $I_2$ corresponds to the electrical load when two of the lamps 218 are turned on. For the same time period, the voltage polarity does not change and remains at −V, because the change from one lamp 218 turned on to two lamps 218 turned on does not represent a change in the maintenance status of the electrical switchgear system 100.

From time $t_2$ to $t_3$, the evaluated electrical load 208 returns to the $I_{idle}$ value, indicating that the lighting system as moved back to the idle state as the two lamps 218 have been turned off. As a result, for the same time period, the voltage polarity changes back to +V, as the signal driver 204 sets the positive polarity based on the evaluated electrical load 208 indicating that all of the lamps 218 are now off.

Figure 9:
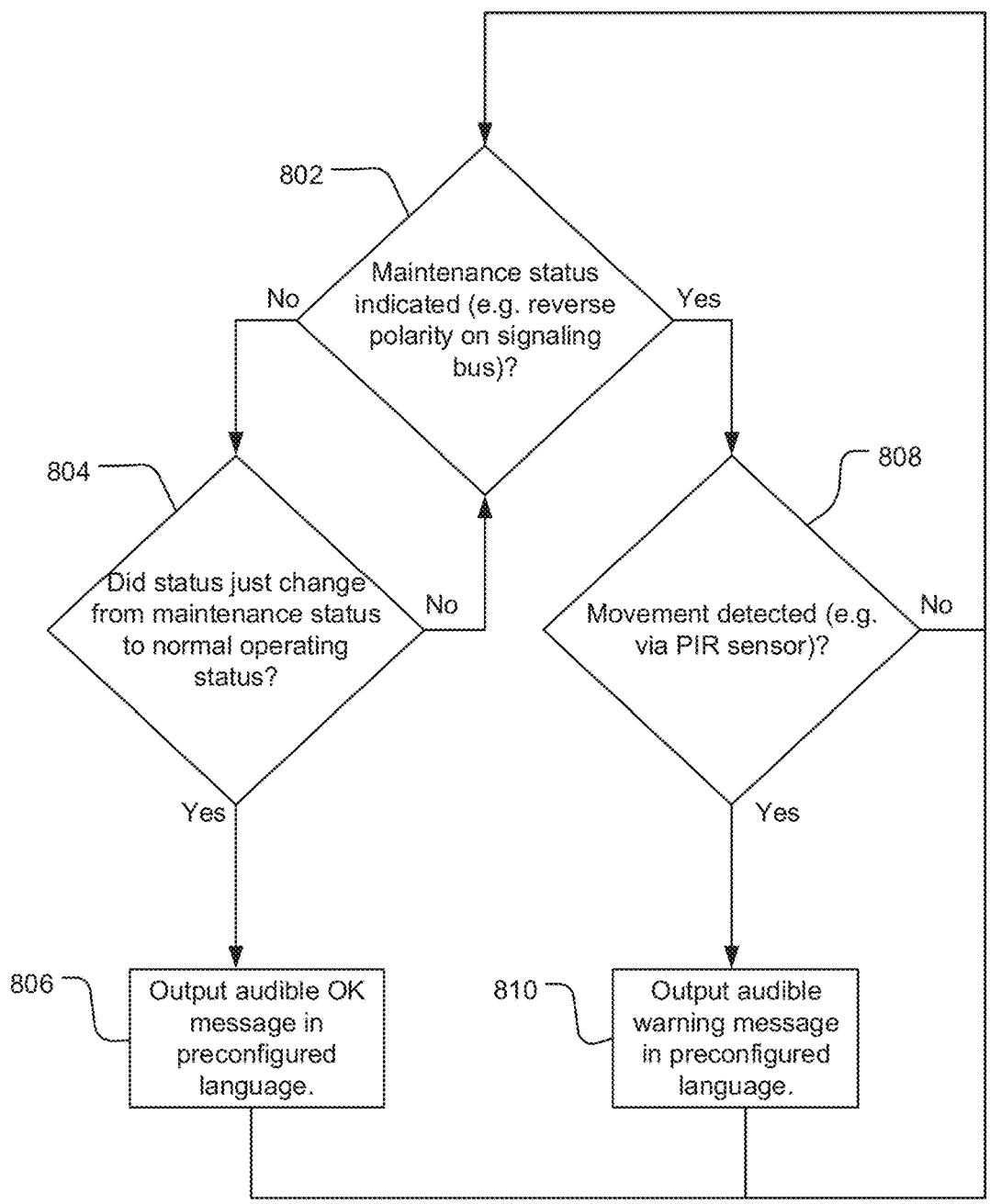
FIG. 9 is a flow diagram illustrating a process by which the sound indicator outputs audible messages.

FIG. 9 is a flow diagram illustrating the process by which the sound indicator 104-S outputs the audible messages based on the maintenance status and whether persons are detected within the signaling area 106.

First, in step 802, it is determined whether the maintenance status is indicated for the electrical switchgear system 100. For example, the bus polarity detector 512 determines whether the signaling bus 310 has the reversed polarity.

If the maintenance status is not indicated (e.g. if instead of the maintenance status the normal operating status is indicated), in step 804, it is determined whether the status just changed from the maintenance status to the normal operating status. If not, no action is taken. If, on the other hand, the status was determined to have changed from the maintenance status to the normal operating status, in step 806, the sound indicator 104-S outputs the OK message indicating that it is safe to approach (for example) in the preconfigured language.

If the maintenance status is indicated (in step 802), in step 808, it is determined whether movement was detected (e.g. via the motion detector 508) and thus whether persons are present in the signaling area 106. If not, no action is taken. However, if motion was detected, in step 810, the sound indicator 104-S outputs the warning message indicating that it is not safe to enter (for example) in the preconfigured language.

In any case, the process returns to step 802 and repeats, as the sound indicator 104-S continuously monitors for changes to the status of the electrical switchgear system 100.

Figure 10:
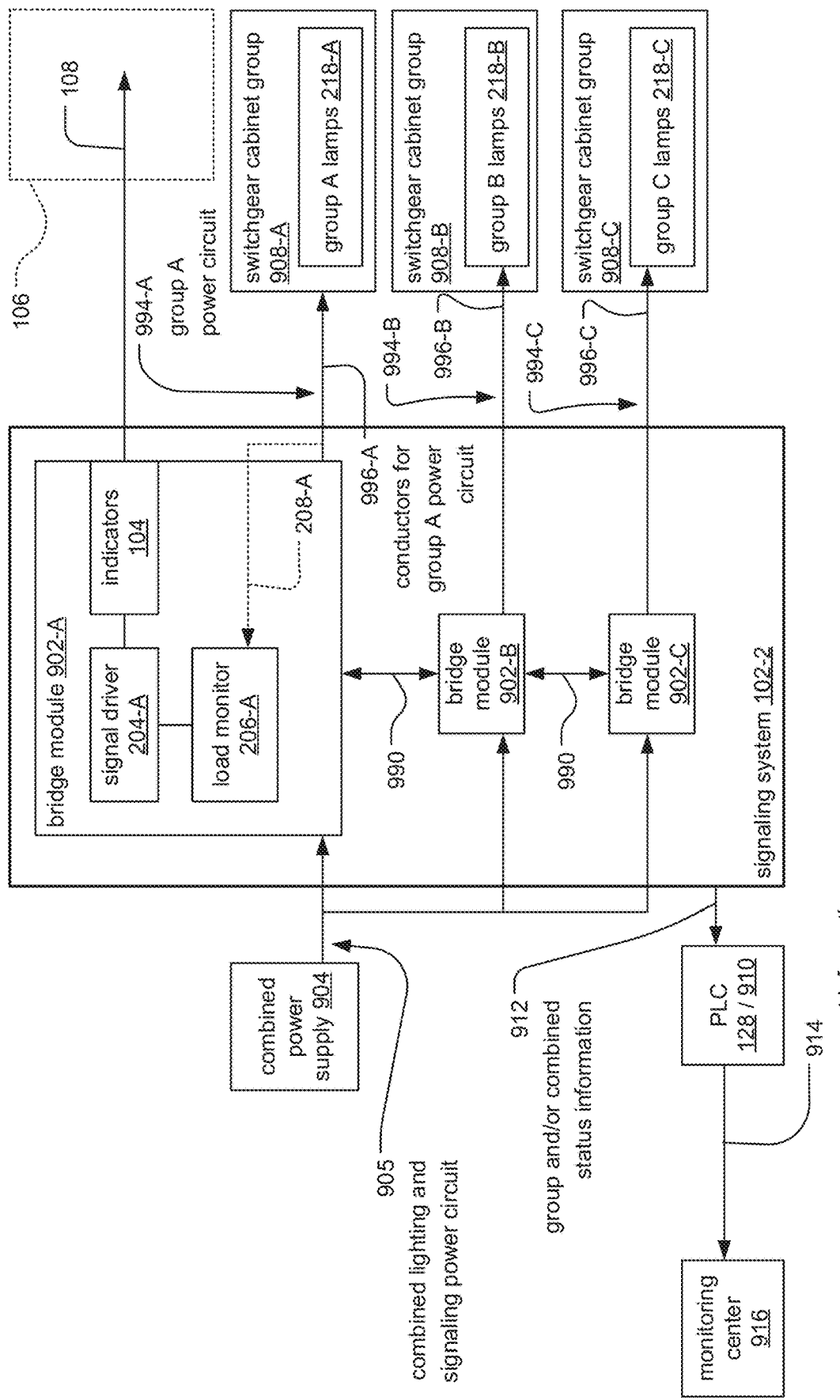
FIG. 10 is a block diagram of the signaling system according to another embodiment of the invention.

FIG. 10 is a block diagram of the signaling system 102-2 according to another embodiment of the invention.

This embodiment of the signaling system, in general, includes one or more bridge modules 902. Each bridge module is associated with a different group 908 of electrical switchgear cabinets 110, with a corresponding set of lamps 218 associated with the electrical switchgear cabinets 110 in the group 908. A combined (e.g. lighting and signaling) power supply 904 provides power to the bridge modules 902 via a combined lighting and signaling power circuit 905. The bridge modules 902, in turn, relay the power from the combined power supply 905 to the lamps 218 in their respective group 908 of switchgear cabinets 110 via respective group power circuits 994 connecting the bridge modules 902 and the lamps 218.

For example, bridge modules 902-A, 902-B, and 902-C each receive power from the combined power supply 904 via the combined lighting and signaling power circuit 905. Bridge module 902-A relays the power to the switchgear cabinet group 908-A to power the group A lamps 218-A via the group A power circuit 994-A, bridge module 902-B relays the power to the switchgear cabinet group 908-B to power the group B lamps 218-B via the group B power circuit 994-B, and bridge module 902-C relays the power to the switchgear cabinet group 908-C to power the group C lamps 218-C via the group C power circuit 994-C.

Each bridge module 902 includes the load monitor 206 and the signal driver 204 as previously described with respect to the signaling system 102-1 and may or may not include the indicators 104.

As before, the load monitor 206 evaluates the electrical load of the power circuit providing power to the lamps 218. In this case, the load monitor 206 of the bridge module 902 evaluates the electrical load of the group power circuit 994 for the group with which the bridge module is associated, for example, by measuring the current flowing through one of the conductors 996 of the group power circuit 994.

In the illustrated example, the bridge module 902-A evaluates the electrical load of the group A power circuit 994-A. For the purpose of clarity, the internal components of bridge modules 902-B and 902-C are not shown in the illustrated example. However, it can be understood that the bridge module 902-B evaluates the electrical load of the group B power circuit 994-B, and the bridge module 902-C evaluates the electrical load of the group C power circuit 994-C.

The signal driver 204 for each bridge module 902 drives the indicators 104 of the bridge module 902, if there are any. For example, bridge modules 902-B and 902-C may not have indicators connected to their respective signal drivers 204. However, the bridge modules 902 connect to each other via a bridge bus 990, through which the bridge modules 902 exchange group status signals indicating the status of the groups 908 monitored by the bridge modules 902. Thus, the signal driver 204 drives the indicators 104 to present combined status information (e.g. indicating the status of the electrical switchgear cabinets 110 in all of the groups 908) based on the group status signals received from all of the other bridge modules 902 via the bridge bus 990. For example, the signal driver 204-A drives the indicators 104 to present the combined status information 108 to persons in the signaling area 106 based on the evaluated electrical load 208-A for group A 208-A as well as the evaluated electrical loads for group B 908-B and group C 908-C.

In general, the signaling system 102-2 outputs status information to an external PLC. The status information could include discrete status information for each group or combined status information for all of the groups collectively. The external PLC might be the control system 128 of the electrical switchgear system 100 or possibly a different independently operating PLC 910. In either case, the PLC 128, 910 generates and sends event information to a monitoring center 916, which might store the event information or take responsive actions based on the event information, among other examples. The event information includes time and date information indicating when maintenance events started and/or stopped, and group identification information, identifying the group 908 for which the maintenance event was detected.

Figure 11:
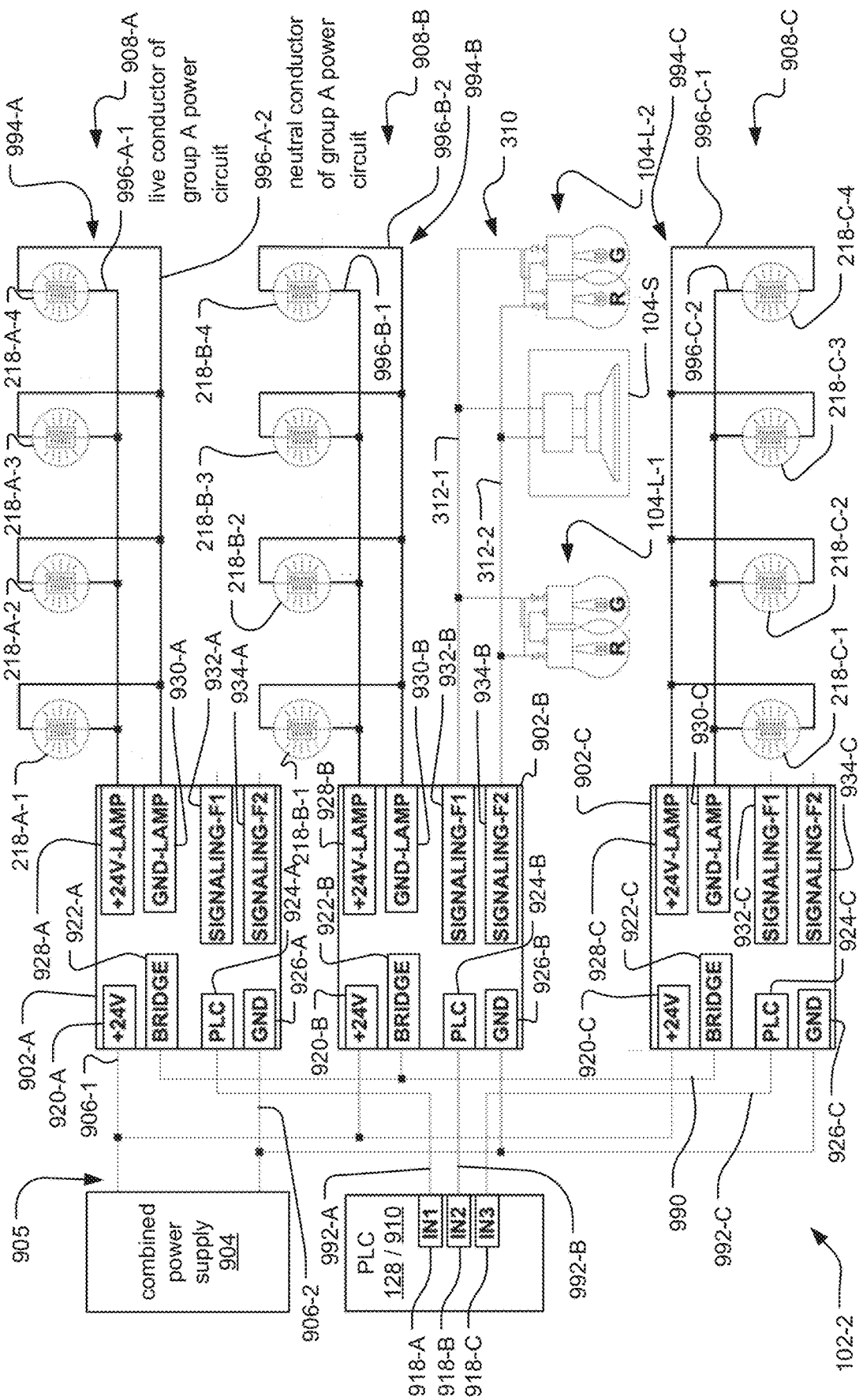
FIG. 11 is a circuit diagram of the signaling system according to another embodiment of the invention.

FIG. 11 is a circuit diagram showing an exemplary embodiment of the signaling system 102-2 including the bridge modules 902.

Three bridge modules 902-A, 902-B and 902-C are shown.

Each of the bridge modules include a combined power input 920, a combined ground output 926, a bridge port 922, a PLC output 924, a lighting power output 928, a lighting ground input 930, a first signaling port 932 and a second signaling port 934.

The bridge modules 902 are powered by the combined power supply 904 via the combined power circuit 905. Specifically, the combined power circuit 905 includes a live conductor 906-1 delivering current to the bridge modules 902 via the combined power input 920 and a neutral conductor 906-2 receiving the current to be returned to the source via the combined ground output 926.

The power received by the bridge modules 902 is relayed to the lamps 218 of the modules' respective groups 908 via the respective group power circuits 994. Specifically, the lighting power output 928 delivers the current to the lamps 218 via a live conductor 996 of the group power circuit 994. The current is returned to the bridge modules 902 via a neutral conductor 996 of the group power circuit 994 via the lighting ground input 930.

The bridge modules 902 evaluate the electrical loads of the respective group power circuits 994, and based on the evaluated electrical loads, the bridge modules 902 output the group status signals onto the bridge bus 990 via the respective bridge ports 922. If the bridge module 104 has a connected signaling bus 310 and indicators 104, the signal driver 204 drives the indicators 104 to present the combined status information based on the locally evaluated electrical load as well as the group status signals from the other bridge modules 902 received via the bridge port 922 and the bridge bus 990. The signal driver 204 would then control the polarity of the signaling bus 310 via the signaling ports 932, 934. In one example, the signal driver 204 sets the first polarity by directing electrical current through the first conductor 312-1 of the signaling bus 310 via the first signaling port 932. The electrical current returns to the bridge module 902 via the second conductor 312-2 and the second signaling port 934. In another example, the signal driver sets the second polarity by directing the electrical current through the second conductor 312-2 via the second signaling port 932, in which case the electrical current returns via the first conductor 312-1 via the first signaling port 934.

In the illustrated example, only bridge module 902-B includes a connected signaling bus 310 and indicators 104. However, these indicators 104 would present status information 108 pertaining to all of the groups 908.

Each of the bridge modules 902 output signals (e.g. the group status signals) to the PLC 128, 910 via the PLC output 924. The signals are sent via discrete connections 992 between each bridge module 902 and the PLC 128, 910, with each discrete connection 992 for each bridge module 902 connecting to a different bridge input 918 of the PLC 128, 910. In this way, the PLC 128, 910 identifies the group 908 from which incoming group status signals originated and can generate event information that includes both a timestamp and identification information for the group 908 where the maintenance event occurred.

Figure 12:
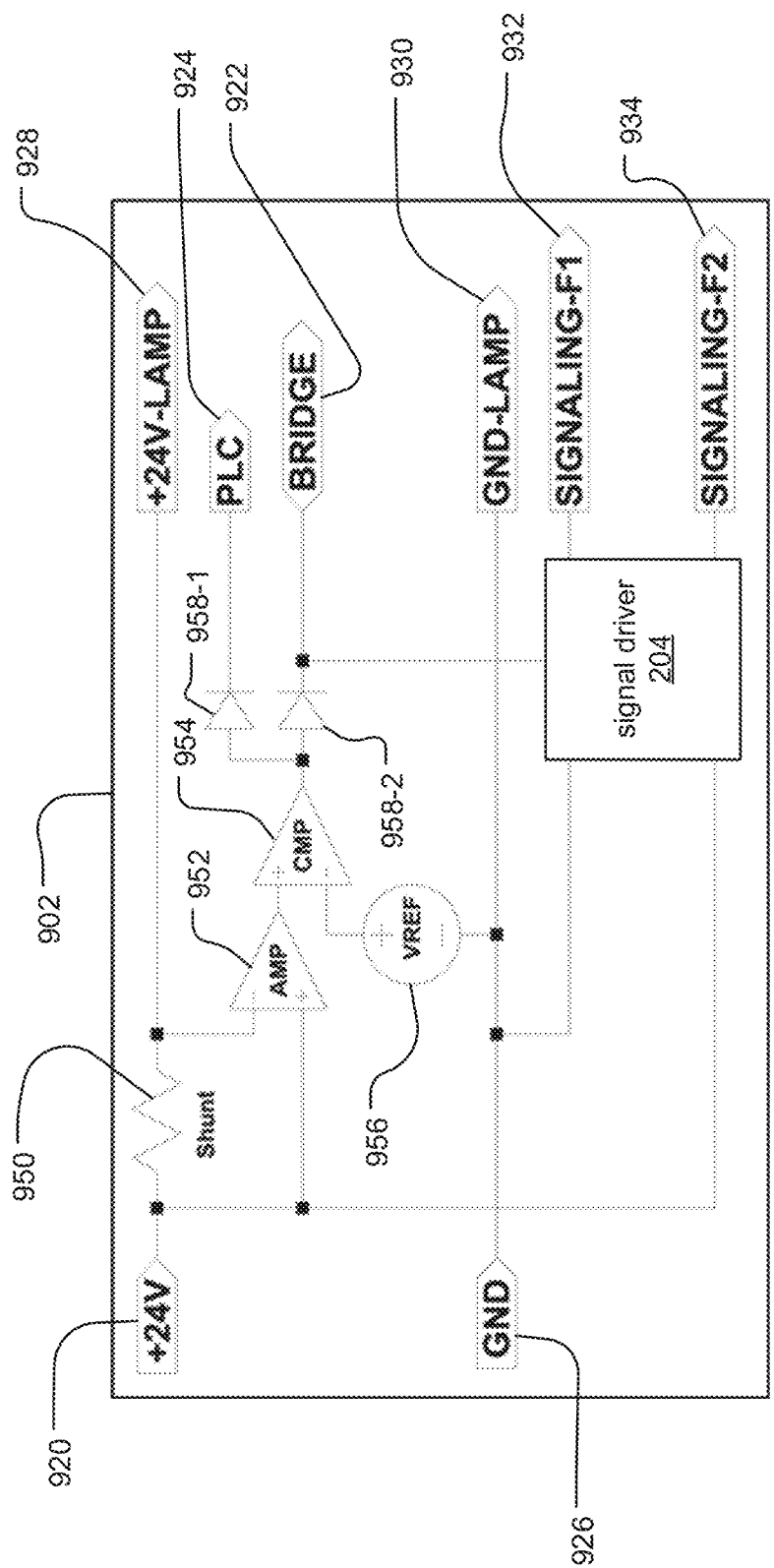
FIG. 12 is a circuit diagram of an exemplary embodiment of a bridge module of the signaling system.

FIG. 12 is a circuit diagram showing the bridge module 902 in more detail.

As before, the bridge module 902 includes the combined power input 920, combined ground output 926, bridge port 922, PLC output 924, lighting power output 928, lighting ground input 930, first signaling port 932 and second signaling port 934. Now, however, additional components are shown, including a shunt resistor 950, an amplifier 952, a comparator 954, a reference voltage source, a first diode 958-1, and a second diode 958-2.

As previously described, the bridge module 902 receives power from the combined power supply 904 via the combined power input 920 and relays the power to the group lighting circuit 994 via the lighting power output 928.

The electrical load for the group lighting circuit 994 is then evaluated by the load monitor 206. More specifically, the current being directed to the lamps 918 via the group lighting circuit 994 passes through the shunt resistor 950, causing a drop in voltage that is amplified by the amplifier 952 and compared by the comparator 954 to the reference voltage 954. The resulting signal, indicating whether one or more of the lamps 218 is drawing power from the group power circuit 994, is output to the PLC 128, 910, to the bridge bus 990 and to the local signal driver 204 via the diodes 958. The bridge bus 990 propagates the signal to the signal drivers 204 of the other bridge modules 902.

As previously described, the signal driver 204 then controls the voltage polarity of the connected signaling bus 310 via the first signaling port 932 and the second signaling port 934.

Figure 13:
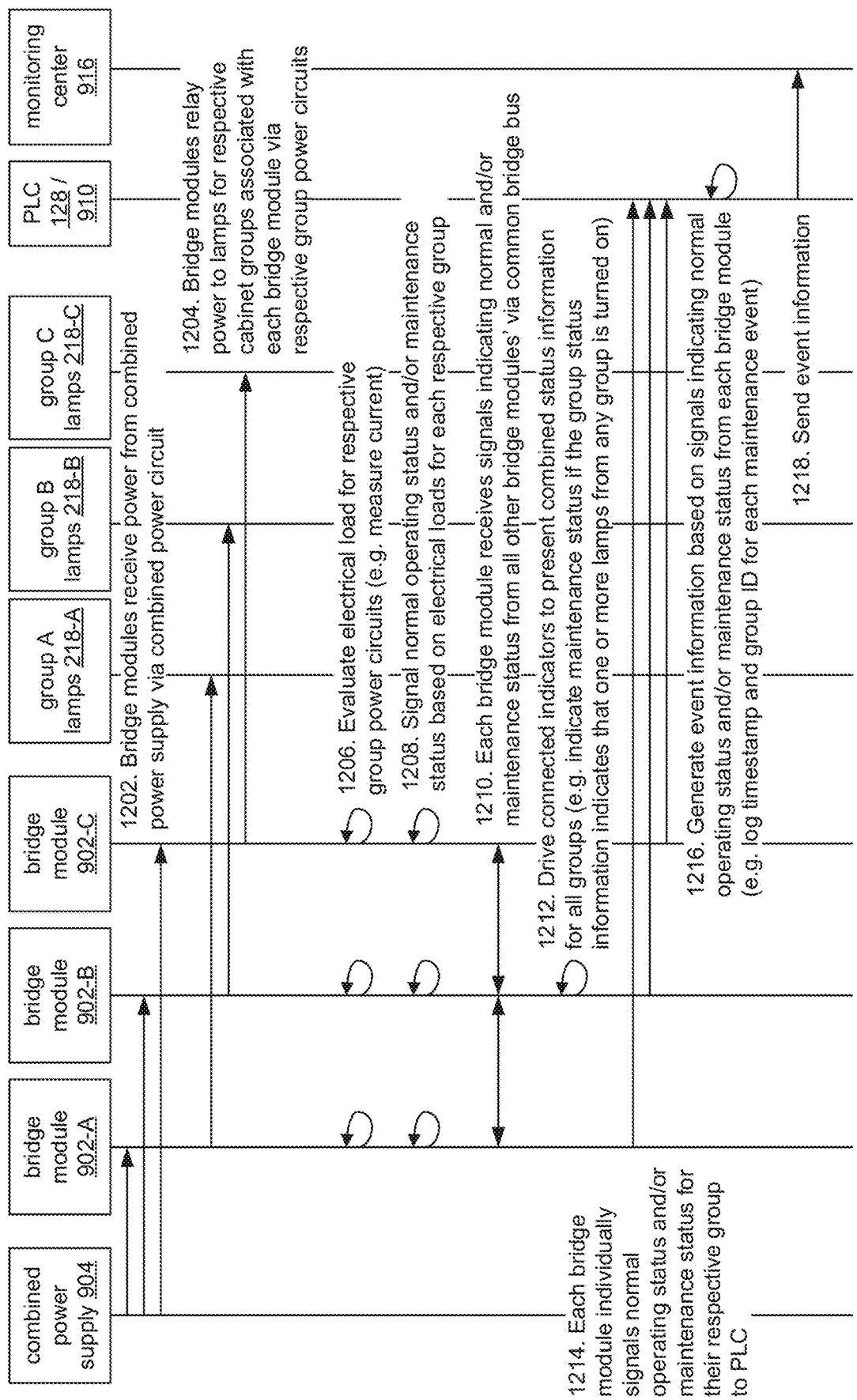
FIG. 13 is a sequence diagram illustrating a process by which the bridge modules determine and present combined status information.

FIG. 13 is a sequence diagram illustrating the process by which the bridge modules 902 determine and present combined status information via the indicators 104 and send the status information to the PLC 128, 910.

First, in step 1202, the bridge modules 902-A, 902-B and 902-C receive power from the combined power supply 904 via the combined power circuit 905. In step 1204, the bridge modules 902-A, 902-B and 902-C relay the received power to the respective groups of lamps 218-A, 218-B and 218-C via the respective group lighting circuits 994-A, 994-B and 994-C.

In step 1206, each of the bridge modules 902-A, 902-B and 902-C then evaluate the electrical load for the respective group lighting circuits 994-A, 994-B and 994-C by, for example, measuring the current passing through one of the conductors 996 of the group lighting circuits 994.

In step 1208, each of the bridge modules 902-A, 902-B and 902-C then signals normal operating status and/or maintenance status for their respective groups 908 based on the evaluated electrical loads 208 for the respective groups 908. These group status signals are shared among the bridge modules in step 1210, as the bridge modules 902-A, 902-B and 902-C receives the group status signals via the bridge bus 990 from all of the other bridge modules 902 connected to the bridge bus 990.

In step 1212, based on the group status signals and/or on the locally evaluated electrical load 208 for the group 908-B, the bridge module 902-B, which has a connected signaling bus 310 with indicators 104, drives the connected indicators 104 to present combined status information for all of the group 908. The combined status information, in one example, indicates the maintenance status if the group status signals indicate that one or more of the lamps 218 from any group 908 is turned on.

In step 1214, each bridge module 902 individuals sends the group status signals indicating the normal operating status and/or maintenance status for the respective groups 908 to the PLC 128, 910.

In step 1216, the PLC 128, 910 generates event information based on the received group status signals from the different groups 908 indicating the normal operating status and/or the maintenance status. In one example, the PLC 128, 910 logs maintenance events with time and date information (e.g. timestamp) and identification information for the group 908 where the maintenance event was located, based on which of the bridge modules 902 sent the group status signal.

In step 1218, the PLC 128, 910 sends the event information to the monitoring center 916, which might store the event information for future use or take responsive actions based on the event information.

While this invention has been particularly shown and described with references to preferred embodiments thereof, it will be understood by those skilled in the art that various changes in form and details may be made therein without departing from the scope of the invention encompassed by the appended claims.

What is claimed is:

1. A signaling system for electrical switchgear cabinets, the signaling system comprising:
   one or more indicators for presenting status information to persons, the status information indicating a normal operating status and/or a maintenance status for the electrical switchgear cabinets;
   one or more load monitors for evaluating an electrical load for one or more power circuits, the power circuits providing power to lamps for illuminating the electrical switchgear cabinets;
   one or more signal drivers for driving the indicators to present the status information based on the evaluated electrical load; and
   one or more attachment mechanisms for securing the load monitor in a position in close proximity to and/or in contact with an exterior surface of an insulation layer surrounding a conductor of the one or more power circuits, wherein the attachment mechanism enables the load monitor to evaluate the electrical load without requiring electrical contact between the load monitor and the conductor.

2. The system as claimed in claim 1, wherein each of the lamps is associated with a single one of the electrical switchgear cabinets and located therein and automatically turns on when a door of the associated electrical switchgear cabinet is opened.

3. The system as claimed in claim 1, wherein the signal driver drives the indicators to present the status information based on whether the evaluated electrical load indicates that one or more of the lamps is turned on.

4. The system as claimed in claim 1, further comprising a comparator for comparing the evaluated electrical load with a predetermined reference value, wherein the signal driver drives the indicators to present the status information based on the comparison.

5. The system as claimed in claim 4, wherein the predetermined reference value is configured to be less than an expected electrical load when one or more of the lamps is turned on.

6. The system as claimed in claim 1, wherein the load monitor comprises a current detector, a current transducer, a current transformer and/or a Hall effect sensor for measuring an electrical current passing through one or more conductors of the power circuits.

7. The system as claimed in claim 1, further comprising light indicators for presenting the status information by emitting light, the light indicators comprising one or more colored light emitting diodes (LED).

8. The system as claimed in claim 1, further comprising sound indicators for presenting the status information by emitting sound, the sound indicators comprising one or more annunciators.

9. The system as claimed in claim 8, wherein the sound indicators comprise amplifiers and speakers for playing audible messages and controllers for determining intended messages to be played via the speakers based on signals from the signal driver.

10. The system as claimed in claim 9, wherein the sound indicators further comprise motion detectors for detecting persons within signaling areas in proximity to the sound indicators, wherein the controllers of the sound indicators determine the intended messages to be played based on whether persons are present in the signaling area.

11. The system as claimed in claim 9, wherein the sound indicators further comprise a multi-language speech engine for selecting between different language versions of the intended messages to be played based on a preconfigured language setting.

12. The system as claimed in claim 9, wherein the sound indicators further comprise nonvolatile memory for storing audio data including the audible messages.

13. The system as claimed in claim 1, wherein the indicators present the status information to persons outside a room containing the electrical switchgear cabinets, within an area surrounding an access point providing access to the room containing the switchgear cabinets.

14. The system as claimed in claim 1, wherein the indicators present the status information to persons located at a remote premises different from a premises containing the electrical switchgear cabinets.

15. A signaling system for electrical switchgear cabinets, the signaling system comprising:
   one or more indicators for presenting status information to persons, the status information indicating a normal operating status and/or a maintenance status for the electrical switchgear cabinets;
   one or more load monitors for evaluating an electrical load for one or more power circuits, the power circuits providing power to lamps for illuminating the electrical switchgear cabinets;
   one or more signal drivers for driving the indicators to present the status information based on the evaluated electrical load; and
   one or more signaling buses for providing connectivity between the one or more signal drivers and the indicators driven by the signal drivers, wherein each signal driver drives indicators connected to the same signaling bus as the signal driver by setting a voltage across the signaling bus, the voltage having one of a first polarity and a second polarity, wherein the first polarity represents the normal operating status, and the second polarity represents the maintenance status.

16. The system as claimed in claim 15, wherein one or more of the indicators comprises a first diode, a second diode, a first lamp and a second lamp, wherein the first diode directs a current flowing through conductors of the signaling bus to power a first lamp when the voltage across the signaling bus has the first polarity, and the second diode directs the current flowing through the conductors to power a second lamp when the voltage of the signaling bus has the second polarity.

17. A signaling system for electrical switchgear cabinets, the signaling system comprising:
one or more indicators for presenting status information to persons, the status information indicating a normal operating status and/or a maintenance status for the electrical switchgear cabinets;
one or more load monitors for evaluating an electrical load for one or more power circuits, the power circuits providing power to lamps for illuminating the electrical switchgear cabinets;
one or more signal drivers for driving the indicators to present the status information based on the evaluated electrical load; and
a plurality of bridge modules electrically connected to each other via a bridge bus of the signaling system, each bridge module being associated with a different group of electrical switchgear cabinets, and each bridge module comprising one of the one or more load monitors and one of the one or more signal drivers, wherein the load monitor of each bridge module evaluates the electrical load for a group power circuit providing power to lamps illuminating the group of electrical switchgear cabinets with which the bridge module is associated, each bridge module sends group status signals over the bridge bus to the other bridge modules based on the evaluated electrical load for the group power circuit, and the signal driver for one or more of the bridge modules drives indicators to present combined status information based on combined group status signals received from all of the bridge modules via the bridge bus.

18. The system as claimed in claim 17, wherein the bridge modules receive power from a combined signaling and lighting power supply, and each bridge module relays power to the group power circuit providing power to the lamps illuminating the group of electrical switchgear cabinets to which the bridge module is associated.

19. The system as claimed in claim 17, wherein each bridge module further comprises an output port for sending the group status signals to an external programmable logic controller (PLC).

20. The system as claimed in claim 19, wherein the PLC generates maintenance event information for each group based on the group status signals received from the bridge modules.

21. The system as claimed in claim 20, wherein the maintenance event information includes time and date information, status information indicating the normal operating status and/or maintenance status for the group, and group identification information.

22. The system as claimed in claim 19, wherein the PLC sends the maintenance event information to a monitoring center.

23. A method for presenting maintenance status information for electrical switchgear cabinets, the method comprising:
evaluating an electrical load for one or more power circuits providing power to lamps for illuminating the electrical switchgear cabinets;
presenting status information to persons based on the evaluated electrical load, the status information indicating a normal operating status and/or a maintenance status for the electrical switchgear cabinets; and
securing the load monitor in a position in close proximity to and/or in contact with an exterior surface of an insulation layer surrounding a conductor of the one or more power circuits via an attachment mechanism, wherein the attachment mechanism enables the load monitor to evaluate the electrical load without requiring electrical contact between the load monitor and the conductors.

24. The method as claimed in claim 23, wherein each of the lamps is associated with a single one of the electrical switchgear cabinets and located therein and automatically turns on when a door of the associated electrical switchgear cabinet is opened.

25. The method as claimed in claim 23, further comprising presenting the status information based on whether the evaluated electrical load indicates that one or more of the lamps is turned on.

26. The method as claimed in claim 23, further comprising presenting the status information based on a comparison of the evaluated electrical load and a predetermined reference value.

27. The method as claimed in claim 26, further comprising configuring the predetermined reference value to be less than an expected electrical load when one or more of the lamps is turned on.

28. The method as claimed in claim 23, further comprising evaluating the electrical load using a current detector, a current transducer, a current transformer and/or a Hall effect sensor by measuring the current passing through one or more conductors of the power circuits.

29. The method as claimed in claim 23, further comprising presenting the status information by emitting light via one or more colored light emitting diodes (LED).

30. The method as claimed in claim 23, further comprising presenting the status information by emitting sound via one or more annunciators.

31. The method as claimed in claim 30, further comprising presenting the status information by determining intended audible messages to be played based on signals indicating the normal operating status and/or the maintenance status and playing the intended audible messages via amplifiers and speakers.

32. The method as claimed in claim 31, further comprising detecting persons within proximity to sound indicators emitting the sound and determining the intended messages to be played based on whether persons are present.

33. The method as claimed in claim 31, further comprising selecting between different language versions of the intended messages to be played based on a preconfigured language setting.

34. The method as claimed in claim 31, further comprising storing audio data including the audible messages in nonvolatile memory.

35. The method as claimed in claim 23, further comprising presenting the status information to persons outside a room containing the electrical switchgear cabinets, within an area surrounding an access point providing access to the room containing the switchgear cabinets.

36. The method as claimed in claim 23, further comprising presenting the status information to persons located at a remote premises different from a premises containing the electrical switchgear cabinets.

37. A method for presenting maintenance status information for electrical switchgear cabinets, the method comprising:

evaluating an electrical load for one or more power circuits providing power to lamps for illuminating the electrical switchgear cabinets;

presenting status information to persons based on the evaluated electrical load, the status information indicating a normal operating status and/or a maintenance status for the electrical switchgear cabinets; and presenting the status information by setting a voltage across a signaling bus connecting one or more indicators for presenting the status information, the voltage having one of a first polarity and a second polarity, wherein the first polarity represents the normal operating status, and the second polarity represents the maintenance status.

38. The method as claimed in claim 37, further comprising one or more of the indicators directing current flowing through conductors of the signaling bus to power a first lamp when the voltage across the signaling bus has the first polarity and directing the current flowing through the conductors of the signaling bus to power a second lamp when the voltage of the signaling bus has the second polarity.

39. A method for presenting maintenance status information for electrical switchgear cabinets, the method comprising:

evaluating an electrical load for one or more power circuits providing power to lamps for illuminating the electrical switchgear cabinets;

presenting status information to persons based on the evaluated electrical load, the status information indicating a normal operating status and/or a maintenance status for the electrical switchgear cabinets; and evaluating electrical loads for group power circuits providing power to lamps for a plurality of different groups of electrical switchgear cabinets and presenting combined status information based on the evaluated electrical loads, the combined status information indicating a collective normal operating status and/or maintenance status for electrical switchgear cabinets in the plurality of different groups.

40. The method as claimed in claim 39, further comprising bridge modules associated with the different groups relaying power from a combined signaling and lighting power supply to the group power circuits providing power to the lamps illuminating the groups of electrical switchgear cabinets to which the bridge modules are associated.

41. The method as claimed in claim 39, further comprising sending group status signals indicating a normal operating status and/or maintenance status for particular groups to an external programmable logic controller (PLC).

42. The method as claimed in claim 41, further comprising the PLC generating maintenance event information for each group based on the received group status signals.

43. The method as claimed in claim 42, wherein the maintenance event information includes time and date information, status information indicating the normal operating status and/or maintenance status for the group, and group identification information.

44. The method as claimed in claim 41, further comprising the PLC sending the maintenance event information to a monitoring center.

\* \* \* \* \*